US00RE39932E

(19) United States
(12) Reissued Patent
Yabu et al.

(10) Patent Number: US RE39,932 E
(45) Date of Reissued Patent: Dec. 4, 2007

(54) SEMICONDUCTOR INTERCONNECT FORMED OVER AN INSULATION AND HAVING MOISTURE RESISTANT MATERIAL

(75) Inventors: Toshiki Yabu, Hirakata (JP); Mizuki Segawa, Hirakata (JP)

(73) Assignee: Matsushita Electric Industrial Co., Ltd., Osaka

(21) Appl. No.: 10/438,348

(22) Filed: May 15, 2003

Related U.S. Patent Documents

Reissue of:
(64) Patent No.: 6,232,656
Issued: May 15, 2001
Appl. No.: 09/387,834
Filed: Sep. 1, 1999

U.S. Applications:
(62) Division of application No. 08/925,442, filed on Sep. 8, 1997, now Pat. No. 5,989,992.

(30) Foreign Application Priority Data

Sep. 10, 1996 (JP) ..... 8-239403

(51) Int. Cl.
*H01L 21/371* (2006.01)
*H01L 29/41* (2006.01)

(52) U.S. Cl. ..... 257/690; 257/773; 257/758; 257/759; 257/760; 257/761; 257/762; 257/763; 257/764; 257/765; 257/915; 257/E23.01

(58) Field of Classification Search ..... 257/690, 257/773
See application file for complete search history.

(56) References Cited

U.S. PATENT DOCUMENTS 4,761,386 A * 8/1988 Buynoski
5,136,364 A * 8/1992 Byrne
5,371,047 A * 12/1994 Greco et al.
5,445,994 A * 8/1995 Gilton
5,472,913 A * 12/1995 Havemann et al.
5,527,737 A * 6/1996 Jeng
5,554,305 A * 9/1996 Wojnarowski et al. ..... 216/62

(Continued)

FOREIGN PATENT DOCUMENTS

| | | | |
|---|---|---|---|
| EP | 0 514 888 A1 | * | 11/1992 |
| EP | 0825646 | * | 2/1998 |
| JP | 58-122447 | | 8/1983 |
| JP | 62128128 | | 6/1987 |
| JP | 62-224037 | * | 10/1987 |
| JP | 62-242331 | | 10/1987 |
| JP | 4-58531 | | 2/1992 |

(Continued)

*Primary Examiner*—Evan Pert
(74) *Attorney, Agent, or Firm*—McDermott Will & Emery LLP

(57) ABSTRACT

A plurality of metal wires are formed on an underlying interlayer insulating film. Areas among the metal wires are filled with a buried insulating film of a silicon oxide film with a small dielectric constant (i.e., a first dielectric film), and thus, a parasitic capacitance of the metal wires can be decreased. On the buried insulating film, a passivation film of a silicon nitride film with high moisture absorption resistance (i.e., a second dielectric film) is formed, and thus, a coverage defect can be avoided. A bonding pad is buried in an opening formed in a part of a surface protecting film including the buried insulating film and the passivation film, so as not to expose the buried insulating film within the opening. Thus, moisture absorption through the opening can be prevented. In this manner, the invention provides a semiconductor device which has a small parasitic capacitance in an area with a small pitch between the metal wires and is free from a coverage defect as well as the moisture absorption through the opening for the bonding pad, and a method of manufacturing the semiconductor device.

32 Claims, 21 Drawing Sheets

U.S. PATENT DOCUMENTS

| | | | | | |
|---|---|---|---|---|---|
| 5,731,584 | A | * | 3/1998 | Beyne et al. | 250/374 |
| 5,746,868 | A | * | 5/1998 | Abe | 156/247 |
| 5,785,236 | A | * | 7/1998 | Cheung et al. | 228/180.5 |
| 5,804,259 | A | * | 9/1998 | Robles | 438/584 |
| 5,807,787 | A | * | 9/1998 | Fu et al. | 438/623 |
| 5,849,632 | A | | 12/1998 | Tuttle et al. | |
| 5,854,127 | A | * | 12/1998 | Pan | 438/598 |
| 5,856,707 | A | * | 1/1999 | Sardella | 257/758 |
| 5,874,779 | A | * | 2/1999 | Matsuno | 257/758 |
| 5,900,668 | A | * | 5/1999 | Wollesen | 257/522 |
| 6,037,215 | A | * | 3/2000 | Lee et al. | 438/253 |

FOREIGN PATENT DOCUMENTS

| | | | |
|---|---|---|---|
| JP | 4-179246 | | 6/1992 |
| JP | 5-198572 | | 6/1993 |
| JP | 7-312386 | | 10/1993 |
| JP | 6-112265 | A | 4/1994 |
| JP | 6-318590 | | 11/1994 |
| JP | 07130737 | * | 5/1995 |
| JP | 9-120963 | | 2/1997 |
| JP | 9-283554 | | 10/1997 |
| WO | 9619826 | * | 6/1996 |

* cited by examiner

SEMICONDUCTOR INTERCONNECT FORMED OVER AN INSULATION AND HAVING MOISTURE RESISTANT MATERIAL

Matter enclosed in heavy brackets [ ] appears in the original patent but forms no part of this reissue specification; matter printed in italics indicates the additions made by reissue.

This is a divisional of application Ser. No. 08/925,442, filed Sep. 8, 1997.

BACKGROUND OF THE INVENTION

The present invention relates to a semiconductor device having a metal wire layer and a passivation film in the uppermost layer and a method of manufacturing the semiconductor device. More particularly, it relates to improvement in the structures of a bonding pad and a surface protecting film.

In accordance with recent refinement of a semiconductor device, there are increasing demands for a semiconductor device having a multilayer wiring structure for increasing a density of each chip and increasing an operation speed. Now, an example of a conventional semiconductor device having the multilayer wiring structure will be decreased.

FIG. 18 is a sectional view for illustrating the structure in the vicinity of the uppermost wires of the conventional semiconductor device. In FIG. 18, a semiconductor substrate and elements such as a transistor disposed thereon are omitted. Also, a semiconductor substrate generally bears interlayer insulating films and metal wires in several layers, but these elements are also omitted in FIG. 18, so as to show merely uppermost metal wires 12, an interlayer insulating film 11 formed under the metal wires 12 and elements formed on them.

As is shown in FIG. 18, on the underlying interlayer insulating film 11 are formed the uppermost metal wires 12 by stacking a Ti film and the like, and a surface protecting film 21 is formed so as to cover the underlying interlayer insulating film 11 and the metal wires 12. In this case, the surface protecting film 21 is a multilayer film including an underlaying insulating film 19 of a thin silicon film and a passivation film 14 of a silicon nitride film. Furthermore, a bonding pad 15 formed out of the same metal film as the metal wires 12 is provided. The surface protecting film 21 is provided with an opening 21a of several tens μm square, so that external electrical connection can be generally attained through the bonding pad 15 exposed within the opening 21a.

FIGS. 19(a) and 19(b) are sectional views for showing manufacturing procedures for the conventional semiconductor device. First, as is shown in FIG. 19(a), the metal wires 12 and the bonding pad 15 are formed on the underlaying interlayer insulating film 11. Then, as is shown in FIG. 19(b), the underlying insulating film 19 and the passivation film 14 are successively deposited on the interlayer insulating film 11 and the metal wires 12. Thereafter, the underlying insulating film 19 and the passivation film 14 are patterned, so as to form the opening 21a as is shown in FIG. 18. Thus, the structure of the semiconductor device as shown in FIG. 18 can be obtained.

Such a conventional structure of the semiconductor device has, however, the following problems. The silicon nitride film for forming the passivation film 14 in the uppermost layer is required to be deposited under conditions of a temperature lower than the melting point of the metal film. Therefore, it is necessary to adopt CVD in plasma atmosphere or the like, which is poor in the step coverage, and hence, it is difficult to attain a good burying characteristic in an area with a small pitch between the wires. As a result, a coverage defect is caused particularly in a concave step portion as is shown in FIG. 20(a), and hence, a defect in reliability due to moisture absorption can be disadvantageously easily caused. On the other hand, another problem occurs when merely the passivation film 14 of the silicon nitride film with a large dielectric constant is formed on the substrate without forming the underlying insulating film so as to improve the moisture absorption resistance as is shown in FIG. 20(b). In this case, in accordance with the refinement of elements, an insulating film with a large dielectric constant is filled in the area between the metal wires with a small pitch. Therefore, a parasitic capacity between the wires is increased in the uppermost layer, resulting in disadvantageously increasing a wiring delay.

In addition, as is shown in FIG. 21, moisture absorption through the underlying insulating film 19 exposed within the opening 21a on the bonding pad 15 can cause a similar problem.

Such a problem owing to the moisture absorption can be more and more serious in a semiconductor device of the next generation, in which a silicon oxide film doped with fluorine and an organic SOG film having a small dielectric constant and high moisture absorption resistance are to be introduced in stead of the silicon nitride film as the passivation film so as to suppress the increase of a parasitic capacitance.

SUMMARY OF THE INVENTION

The present invention was devised in view of the aforementioned conventional problems. The object is providing a semiconductor device having high integration, high reliability and high performance and a method of manufacturing the semiconductor device, by decreasing a parasitic capacitance between metal wires with a small pitch in a metal wire layer, by preventing a coverage defect in depositing a silicon nitride film used as a passivation film, and by suppressing moisture absorption through an opening for forming a bonding pad.

The semiconductor device of this invention comprises a semiconductor substrate bearing semiconductor elements; an interlayer insulating film formed on the semiconductor substrate; a metal wire layer including plural metal wires formed on the interlayer insulating film; a surface protecting film including a first dielectric film with a small dielectric constant for filling at least a part of areas among the metal wires in the metal wire layer and a second dielectric film with a higher moisture absorption preventing function than the first dielectric film for covering the metal wire layer and the first dielectric film; an opening for a bonding pad formed in the surface protecting film; and a bonding pad formed in the opening for obtaining external electrical connection, wherein the bonding pad and the second dielectric film of the surface protecting film completely cover the first dielectric film within the opening so as not to expose the first dielectric film.

Owing to this structure, the following effects can be attained: Since the area between the metal wires of the metal wire layer is filled with the first dielectric film with a small dielectric constant, the parasitic capacitance of the metal wires can be decreased. Furthermore, since the first dielectric film within the opening is covered with the bonding pad and the second dielectric film so as not to expose the first dielectric film, the moisture absorption through the opening can be prevented.

The first dielectric film preferably is buried, among the areas among the metal wires, at least in an area having a minimum pitch between the metal wires.

Thus, the area with a small pitch in the metal wire layer can be filled with the first dielectric film with a small dielectric constant, and hence, the parasitic capacitance of the metal wires can be decreased. Moreover, since the first dielectric film with a small dielectric constant has good coverage, a coverage defect in the area with a small pitch in the metal wire layer can be avoided.

In one aspect, the first dielectric film can be formed on the interlayer insulating film and the metal wires, and the second dielectric film can be formed over the first dielectric film; the opening can be formed through the first and second dielectric films, with exposing a part of at least one of the metal wires of the metal wire layer; and the bonding pad can be buried in the opening so as to cover a side face of the first dielectric film within the opening and can be connected with the at least one of the metal wires.

In another aspect, the bonding pad can extend above a top surface of the second dielectric film.

Also in these aspects, the aforementioned effects can be exhibited.

In one aspect, the bonding pad can have an area larger than a connecting portion with the at least one of the metal wires, and can extend above a top surface of the second dielectric film to reach a portion above the semiconductor elements on the semiconductor substrate.

As a result, the integration of the semiconductor device can be improved.

In one aspect, the bonding pad can be buried in the opening with a top surface thereof placed at a level lower than a top surface of the second dielectric film and higher than a top surface of the first dielectric film.

As a result, the bonding pad can be formed in a self-alignment manner, and hence, the manufacturing cost can be decreased as a result of simplification of the manufacturing procedures.

In one aspect, a third dielectric film for preventing moisture absorption can be disposed between the first dielectric film and any of the interlayer insulating film and the metal wires.

Thus, a further higher moisture absorption preventing function can be attained.

In one aspect, the first dielectric film can be formed merely in the areas among the metal wires; the second dielectric film can be formed to be in contact with a top surface of the first dielectric film and top surfaces of the metal wires of the metal wire layer; the opening can be formed through merely the second dielectric film; and a part of at least one of the metal wires can function as the bonding pad.

In another aspect, the first and second dielectric films can be formed merely in the areas among the metal wires, and a part of at least one of the metal wires of the metal wire layer can function as the bonding pad.

In still another aspect, a thin etching stopper film with high etching selectivity against the interlayer insulating film can be disposed between the first dielectric film and the interlayer insulating film.

In these aspect, there is no need to provide a metal film for forming the bonding pad on the metal wire layer, and hence, the manufacturing cost can be decreased as a result of simplification of the structure and the manufacturing procedures.

In one aspect a third dielectric film for preventing moisture absorption can be disposed between the first dielectric film and any of the interlayer insulating film, the metal wires and the second dielectric film.

The third dielectric film is preferably made from a silicon nitride film.

The film dielectric film is preferably made from at least one oxide film selected from the group consisting of a silicon oxide film, a silicon oxide film doped with fluorine and a porous silicon oxide film, or a composite film including an organic insulating film and at least one oxide film selected from the group consisting of a silicon oxide film, a silicon oxide film doped with fluorine and a porous silicon oxide film.

The first dielectric film preferably has a dielectric constant of 3.9 or less.

The second dielectric film is preferably made from a silicon nitride film.

The first method of manufacturing a semiconductor device of this invention comprises a first step of forming a metal wire layer including plural metal wires on an interlayer insulating film on a semiconductor substrate bearing semiconductor elements; a second step of forming a surface protecting film including a first dielectric film with a small dielectric constant and a second dielectric film with a higher moisture absorption preventing function than the first dielectric film by filling at least a part of areas among the metal wires of the metal wire layer with the first dielectric film and by depositing the second dielectric film on the first dielectric film; a third step of forming an opening through the surface protecting film so as to expose a part of at least one of the metal wires of the metal wire layer; and a fourth step of forming a bonding pad of a metal film connected with the at least one of the metal wires by filling the opening so as to cover at least the first dielectric film exposed to side faces of the opening.

In one aspect, in the second step, among the areas among the metal wires, at least an area having a minimum pitch between the metal wires can be filled with the first dielectric film.

Through this method, a semiconductor device which can exhibit the aforementioned effects can be manufactured.

In one aspect, in the fourth step, the bonding pad can be formed by depositing the metal film within the opening and on the second dielectric film and by patterning the metal film.

In another aspect, in the fourth step, the bonding pad can be formed so as to have an area larger than a connecting portion with the at least one of the metal wires and extend to reach a portion above the semiconductor elements on the semiconductor substrate.

In these aspects, a semiconductor device with particularly high integration can be manufactured.

In one aspect, in the fourth step, the bonding pad can be formed in a self-alignment manner by depositing the metal film within the opening and on the second dielectric film and by removing the metal film until a top surface of the second dielectric film is exposed so that the metal film remains in the opening alone.

In another aspect, in the fourth step, the bonding pad can be formed in a self-alignment manner by depositing the metal film within the opening by selective CVD.

In these aspects, a step of forming a mask for patterning a metal film for the bonding pad can be omitted, and hence, the manufacturing cost can be decreased.

In one aspect, prior to the second step, a thin third dielectric film for preventing moisture absorption can be deposited so as to cover the interlayer insulating film and the metal wires, and in the third step, the opening can be formed also through a part of the third dielectric film.

Thus, a semiconductor device with particularly high moisture absorption resistance can be manufactured. In addition, since the third dielectric film with high moisture absorption resistance generally has high etching selectivity against a silicon oxide film used as the interlayer insulating film, the manufacturing procedures can be effected without harmfully affecting the interlayer insulating film.

The second method of manufacturing a semiconductor device of this invention comprises a first step of forming a metal wire layer including plural metal wires on an interlayer insulating film on a semiconductor substrate bearing semiconductor elements; a second step of depositing a first dielectric film with a small dielectric constant on the interlayer insulating film and the metal wires and removing the first dielectric film until a top surface of the metal wire layer is exposed so that the first dielectric film remains merely in areas among the metal wires; a third step of depositing a second dielectric film with a higher moisture absorption preventing function than the first dielectric film on the first dielectric film and the metal wires; and a fourth step of forming an opening through the second dielectric film so as to expose a part of at least one of the metal wires of the metal wire layer, wherein a part of the at least one of the metal wires functions as a bonding pad.

In one aspect, the method can further comprises, after the first step and prior to the second step, a step of forming a thin third dielectric film for preventing moisture absorption so as to cover the interlayer insulating film and the metal wires, and in the fourth step, the opening can be formed also through the third dielectric film.

The third method of manufacturing a semiconductor device of this invention comprises a first step of forming, on an interlayer insulating film on a semiconductor substrate bearing semiconductor elements, an etching stopper film with high etching selectivity against the interlayer insulating film; a second step of depositing a first dielectric film with a small dielectric constant on the etching stopper film; a third step of forming plural grooves for burying metal wires by selectively removing a part of the first dielectric film; a fourth step of forming a metal wire including plural metal wires in the grooves by depositing a metal film within the grooves and on the first dielectric film and by removing the metal film until a top surface of the first dielectric film is exposed; a fifth step of depositing a second dielectric film a with higher moisture absorption preventing function than the first dielectric film on the first dielectric film and the metal wires; and a sixth step of forming an opening for exposing a part of at least one of metal wires of the metal wire layer by selectively removing a part of the second dielectric film, wherein a part of the at least one of the metal wires functions as a bonding pad.

The fourth method of manufacturing a semiconductor device of this invention comprises a first step of forming, on an interlayer insulating film on a semiconductor substrate bearing semiconductor elements, an etching stopper film with high etching selectivity against the interlayer insulating film; a second step of depositing a first dielectric film with a small dielectric constant on the etching stopper film; a third step of depositing a second dielectric film with a higher moisture absorption preventing function than the first dielectric film on the first dielectric film; a fourth step of forming plural grooves for burying metal wires by selectively removing a part of the first and second dielectric films; and a fifth step of forming a metal wire layer including plural metal wires in the grooves by depositing a metal film within the grooves and on the dielectric film and by removing the metal film until a top surface of the second dielectric film is exposed, wherein a part of at least one of the metal wires functions as a bonding pad.

In the second through fourth methods, a step of forming a metal film for the bonding pad apart from the metal wire layer and a step of patterning the metal film can be omitted, resulting in largely decreasing the manufacturing cost.

DETAILED DESCRIPTION OF THE INVENTION

Embodiment 1

Figure 1:
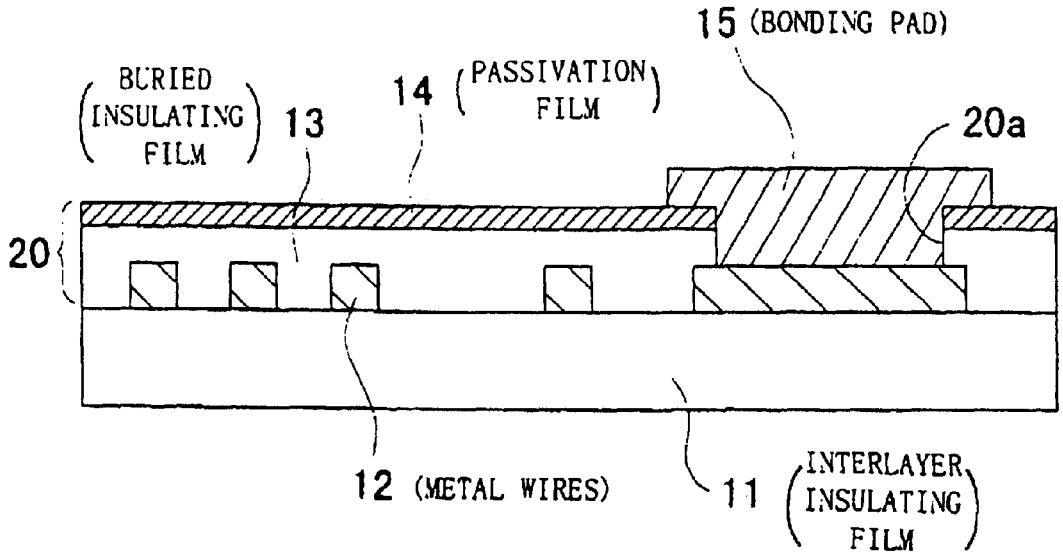
FIG. 1 is a sectional view of a semiconductor device according to a first embodiment.

A first embodiment of the invention will now be described. FIG. 1 is a sectional view for showing the structure of a semiconductor device according to the first embodiment, whereas a semiconductor substrate and other elements such as a transistor disposed thereon are omitted in FIG. 1. Furthermore, a semiconductor substrate generally bears interlayer insulating films and metal wires in several layers, but these elements are also omitted in the drawings illustrating this embodiment and all other embodiments described below because these elements have no relation to the characteristics of the present invention. Accordingly, merely uppermost metal wires 12, an interlayer insulating film 11 formed under the metal wires 12 and elements formed on them are shown in FIG. 1.

As is shown in FIG. 1, on the underlying interlayer insulating film 11 is formed a metal wire layer including a plurality of metal wires 12, which are formed by stacking and then patterning a Ti film and the like. Furthermore, a surface protecting film 20 is formed so as to cover the interlayer insulating film 11 and the metal wires 12. The surface protecting film 20 is a composite film including a buried insulating film 13 of an insulating film with a small dielectric constant (such as a TEOS film) and a passivation film 14 of an insulating film with a large dielectric constant and high moisture absorption resistance (such as a silicon nitride film). In areas among the metal wires 12 directly below the surface protecting film 20, the buried insulating film 13 with a small dielectric constant is formed at least in an area with the smallest wire pitch. Also, a bonding pad 15 is buried in an opening 20a of the surface protecting film 20 of the composite film, so as to be connected with the metal wire 12. Also, the bonding pad 15 completely covers the side faces of the buried insulating film 13 with a small dielectric constant within the opening 20a and is drawn above the passivation film 14.

At this point, the bonding pad 15 is formed so as to be exposed above the passivation film 14, and hence is preferably formed out of not an easily oxidized metal such as Cu but an electrode material mainly including an Al or Au type alloy.

Now, manufacturing procedures for the semiconductor device of FIG. 1 will be described with reference to FIGS. 2(a) through 2(d).

Figure 2A:
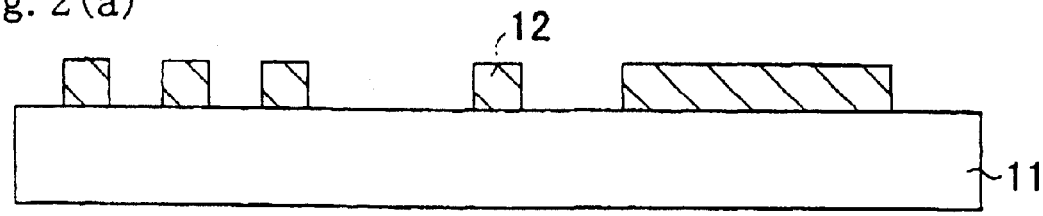
FIGS. 2(a) through 2(d) are sectional views for illustrating manufacturing procedures for the semiconductor device of the first embodiment.

First, as is shown in FIG. 2(a), the interlayer insulating film 11 is formed on the substrate already bearing other elements, and the metal wires 12 are formed thereon. At this point, the interlayer insulating film 11 is formed out of a TEOS film (with a dielectric constant of approximately 3.5) deposited by the CVD in the plasma atmosphere. The surface of the interlayer insulating film 11 is flattened by chemical mechanical polishing (CMP) or the like. Furthermore, the metal wires 12 are formed by stacking and then patterning a Ti type barrier metal with a thickness of approximately 100 nm, an Al type alloy film with a thickness of approximately 1000 nm and a Ti type anti-reflective film with a thickness of approximately 50 nm.

Figure 2B:
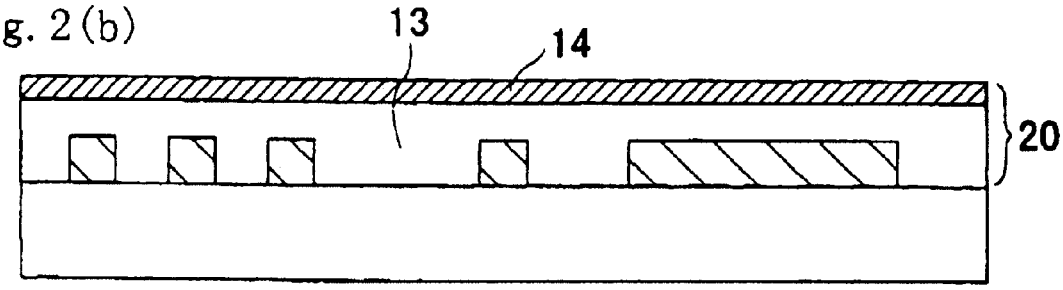

Then, as is shown in FIG. 2(b), the buried insulating film 13 with a small dielectric constant and the passivation film 14 with a large dielectric constant and high moisture absorption resistance are successively deposited, thereby forming the surface protecting film 20 of the composite film including these films. At this point, the buried insulating film 13 with a small dielectric constant is formed out of a TEOS film (with a dielectric constant of approximately 3.5) deposited by the CVD in the plasma atmosphere. The passivation film 14 is formed out of a silicon nitride film (with a dielectric constant of approximately 7.5) deposited by the CVD in the plasma atmosphere. The TEOS film has a thickness of 800 nm and the silicon nitride film has a thickness of 100 nm. At this point, merely the buried insulating film 13 with a small dielectric constant is buried in at least a part of the areas among the metal wires 12, and more preferably at least an area with the minimum wire pitch.

At this point, before depositing the silicon nitride film as the passivation film 14, the surface of the buried insulating film 13 is preferably flattened over the entire surface of the semiconductor substrate by the CMP or the like as is shown in FIG. 2(b). In such a case, the TEOS film is previously deposited in a thickness of approximately 1500 nm, and this TEOS film is polished by approximately 700 nm, so that the resultant TEOS film has a thickness of 800 nm. In this manner, the fine area between the metal wires 12 can be filled with the buried insulating film 13 with a small dielectric constant. Thus, there is no need to consider a coverage defect at a step portion of the passivation film 14 formed thereon, and there is no fear of occurrence of a pin hole and a crack and local stress increase. As a result, the thickness of the passivation film 14 can be set at a necessary minimum value.

Figure 2C:
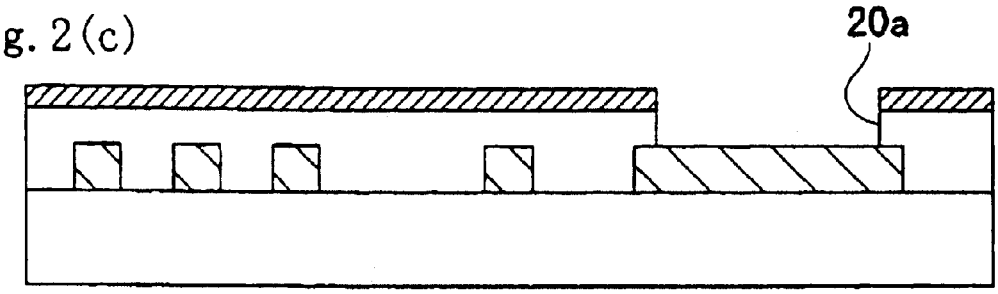
Figure 2D:
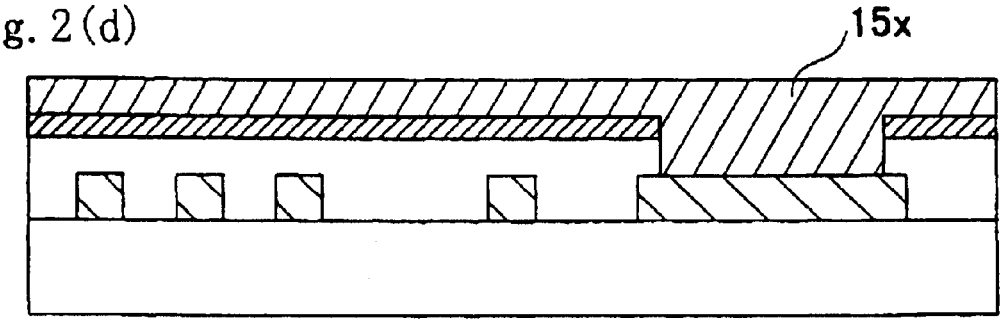

Subsequently, as is shown in FIG. 2(c), the opening 20a is formed in an area for forming the bonding pad in the surface protecting film 20 including the films 13 and 14. Furthermore, as is shown in FIG. 2(d), a metal film 15x is deposited so as to fill the opening 20a of the surface protecting film 20 and extend over the passivation film 14. At this point, the metal film 15x can be formed by stacking a Ti type barrier metal with a thickness of approximately 100 nm, an Al type alloy film with a thickness of approximately 1000 nm, and a Ti type anti-reflective film with a thickness of approximately 50 nm.

Procedures thereafter are herein omitted, and the metal film 15x of FIG. 2(d) is patterned, so as to form the bonding pad 15 as is shown in FIG. 1. Thus, the structure of the semiconductor device of the first embodiment can be obtained.

The types and the thickness of the films used as the respective elements described above are merely given as examples, and it goes without saying that other compositions are applicable.

In the procedure for forming the metal film 15x in the area for forming the bonding pad 15 in this embodiment, the opening 20a having substantially the same area as the bonding pad 15 is formed on the metal wire 12 below.

In this embodiment, at least the area with a small pitch among the areas among the metal wires 12 is filled with the dielectric film (buried insulating film 13) with a small dielectric constant. Accordingly, a parasitic capacitance of the wires can be decreased. Also, since the silicon nitride film used as the passivation film 14 is deposited on the underlying thick interlayer insulating film 11, a coverage defect can be avoided. Moreover, in order to suppress moisture absorption through exposed portions of the passivation film 14 and the buried insulating film 13 therebelow within the opening 20a for the bonding pad 15, the exposed portions are completely covered with the bonding pad 15. Thus, the resultant semiconductor device can exhibit high reliability and high performance.

Embodiment 2

Figure 3:
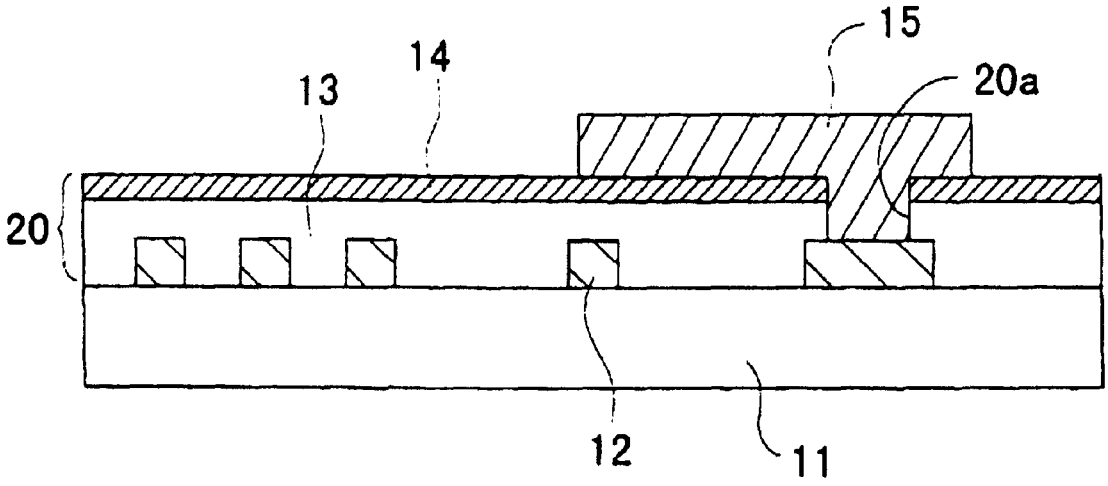
FIG. 3 is a sectional view of a semiconductor device according to a second embodiment.
Figure 4A:
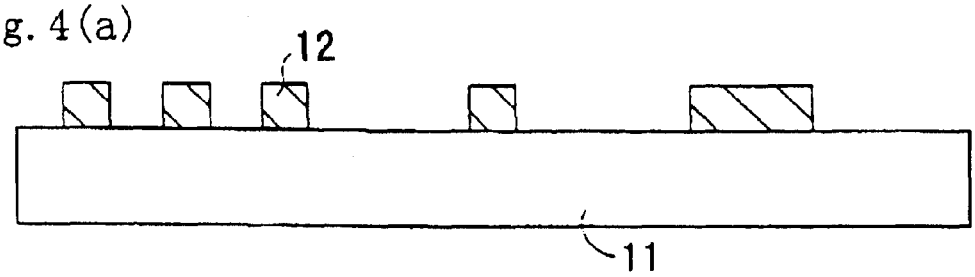
FIGS. 4(a) through 4(d) are sectional views for illustrating manufacturing procedures for the semiconductor device of the second embodiment.
Figure 4B:
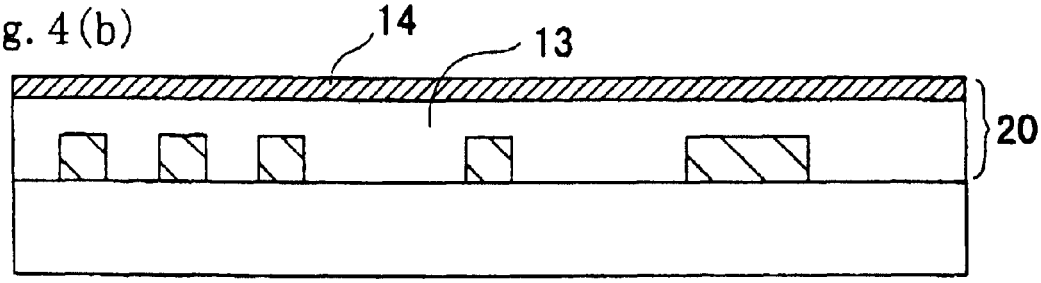
Figure 4C:
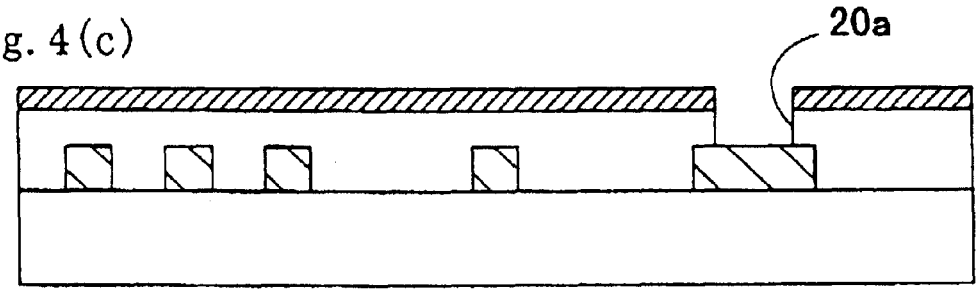
Figure 4D:
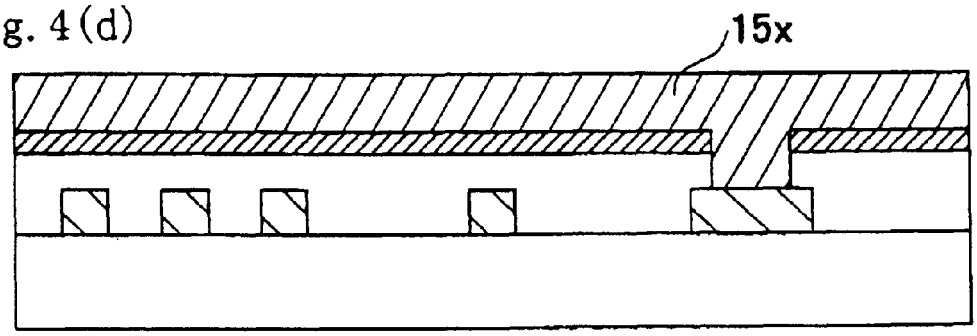

A second embodiment of the invention will now be described. FIG. 3 is a sectional view for showing the structure of a semiconductor device of the second embodiment.

The semiconductor device of this embodiment is different from the semiconductor device of the first embodiment shown in FIG. 1 as follows: In the semiconductor device of this embodiment, an area of a bonding pad 15 extending above a passivation film 14 is remarkably larger than an area of an opening 20a formed in a surface protecting film 20 and an area of a wire connected with the bonding pad 15. In other words, the area occupied by metal wires 12 is smaller in this semiconductor device.

Accordingly, the bonding pad 15, which is provided in the same layer as the uppermost wires (i.e., the metal wires 12) in the first embodiment, is provided in a different layer (i.e.; on the surface protecting film) in this embodiment, and hence, this embodiment can not only attain the same effects attained by the first embodiment but also decrease the area of input/output portions, which occupy a large area in a chip, and can improve the freedom in design. Thus, the integration of the semiconductor device can be improved.

FIGS. 4(a) through 4(d) are sectional views for showing manufacturing procedures for the semiconductor device of the second embodiment. The manufacturing procedures of this embodiment are basically the same as those shown in FIGS. 2(a) through 2(d) except for the following points: In the procedure shown in FIG. 4(a), the area of one of the metal wires 12 connected with the bonding pad 15 is smaller than the area of the bonding pad 15; the opening 20a formed in the surface protecting film 20 in the procedure shown in FIG. 4(c) has a much smaller area than the area for forming the bonding pad 15; and a metal film 15x deposited for forming the bonding pad 15 in the procedure shown in FIG. 4(d) has a very large thickness. In other words, through the manufacturing procedures of this embodiment, the bonding pad 15 is formed so as to extend over an area above the semiconductor elements as is shown in FIG. 3. However, since a portion of the bonding pad 15 disposed on the passivation film 14 has a large thickness, the surface protecting film 20 and the like therebelow cannot be harmfully affected by a pressure applied to the bonding pad 15 in a wire bonding process and the like.

In this manner, according to the second embodiment, a semiconductor device with high reliability and high performance can be obtained as in the first embodiment. In addition, since the bonding pad is formed so as to extending over the area above the semiconductor elements, the integration of the semiconductor device can be further improved.

Embodiment 3

Figure 5:
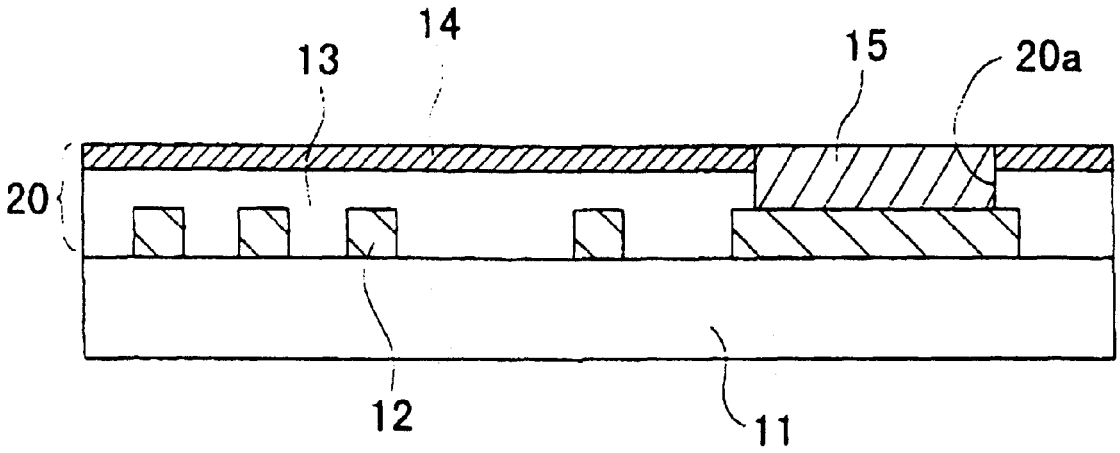
FIG. 5 is a sectional view of a semiconductor device according to a third embodiment.

A third embodiment of the invention will now be described. FIG. 5 is a sectional view for showing the structure of a semiconductor device of the third embodiment.

As is shown in FIG. 5, on an underlying interlayer insulating film 11 is formed a metal wire layer including a plurality of metal wires 12 formed by stacking and then patterning a Ti film and the like. Furthermore a surface protecting film 20 is formed so as to cover the interlayer insulating film 11 and the metal wires 12. The surface protecting film 20 is a composite film including a buried insulating film 13 of an insulating film with a small dielectric constant (such as a TEOS film) and a passivation film 14 of an insulating film with a large dielectric constant and high moisture absorption resistance (such as a silicon nitride film). In areas among the metal wires 12 directly below the surface protecting film 20, at least an area having the minimum wire pitch is filled with merely the buried insulating film 13 with a small dielectric constant. Also, a bonding pad 15 is buried in an opening 20a of the surface protecting film 20 so as to be connected with the metal wire 12. The bonding pad 15 covers the entire or at least a lower part of the side faces of the buried insulating film 13 with a small dielectric constant within the opening 20a but is not drawn above the passivation film 14. This is a difference from the structures of the semiconductor devices of the first and second embodiments. In other words, the top surface of the bonding pad 15 is placed at the same level as or a lower level than the top surface of the passivation film 14.

At this point, since the bonding pad 15 is formed to be exposed, the bonding pad 15 is preferably formed out of not an easily oxidized metal such as Cu but an electrode material mainly including an Al or Au type alloy.

Now, manufacturing procedures for the semiconductor device of this embodiment will be described with reference to FIGS. 6(a) through 6(d).

Figure 6A:
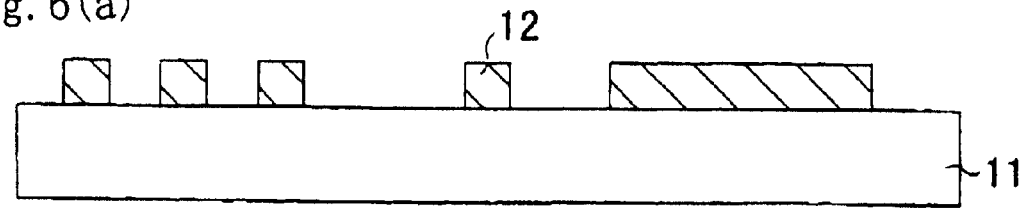
FIGS. 6(a) through 6(d) are sectional views for illustrating manufacturing procedures for the semiconductor device of the third embodiment.

First, as is shown in FIG. 6(a), the interlayer insulating film 11 is formed on a substrate already bearing other elements, and the metal wires 12 are formed thereon. At this point, the interlayer insulating film 11 is formed out of a TEOS film (with a dielectric constant of approximately 3.5) deposited by the CVD in the plasma atmosphere. The surface of the interlayer insulating film 11 is flattened by the CMP or the like. The metal wires 12 are formed by stacking and then patterning a Ti type barrier metal with a thickness of approximately 100 nm, an Al type alloy film with a thickness of approximately 1000 nm and a Ti type anti-reflective film with a thickness of approximately 50 nm.

Figure 6B:
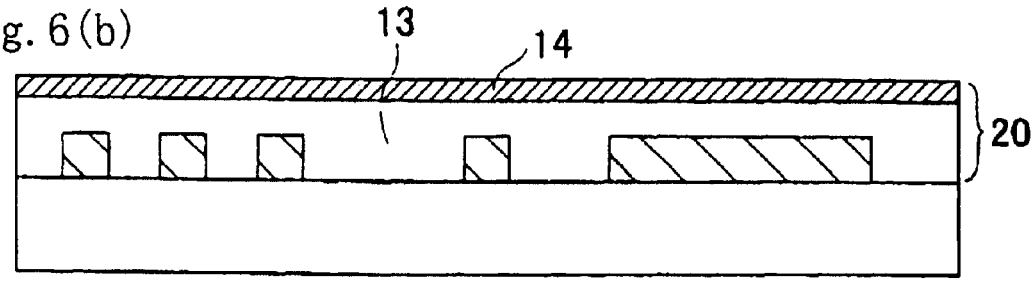

Next, as shown in FIG. 6(b), the buried insulating film 13 with a small dielectric constant and the passivation film 14 with a large dielectric constant and high moisture absorption resistance are successively deposited, thereby forming the surface protecting film 20 of the composite film including these films. At this point, the buried insulating film 13 with a small dielectric constant is formed out of a TEOS film (with a dielectric constant of approximately 3.5) deposited by the CVD in the plasma atmosphere. The passivation film 14 is formed out of a silicon nitride film (with a dielectric constant of approximately 7.5) deposited by the CVD in the plasma atmosphere. The TEOS film has a thickness of 800 nm and the silicon nitride film has a thickness of 100 nm. At this point, in areas among the metal wires 12, at least an area with the minimum wire pitch is filled with merely the buried insulating film 13 with a small dielectric constant.

At this point, the surface of the buried insulating film 13 is preferably flattened over the entire surface of the semiconductor substrate by the CMP or the like before depositing the silicon nitride film as is shown in FIG. 6(b). In this case, the TEOS film is previously deposited in a thickness as large as approximately 1500 nm, and is polished by approximately 700 nm, so that the resultant TEOS film has a thickness of 800 nm. Since the fine area between the metal wires 12 is filled with the buried insulating film 13 with a small dielectric constant in this manner, there is no need to consider the coverage defect at a step portion of the passivation film 14 formed thereon, and these is no fear of the occurrence of a pin hole and a crack and the local stress increase. Thus, the thickness of the passivation film 14 can be set at a necessary minimum value.

Figure 6C:
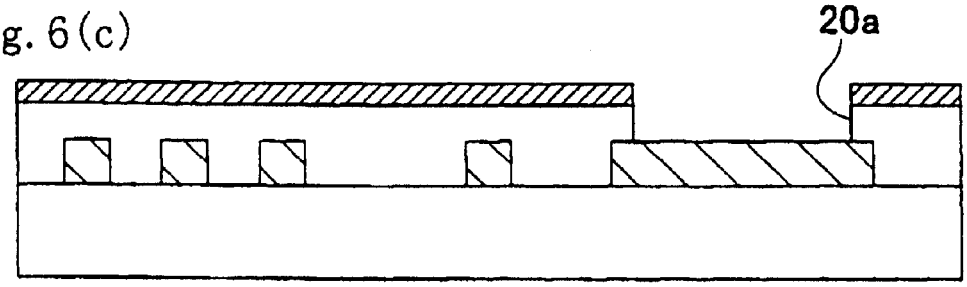
Figure 6D:
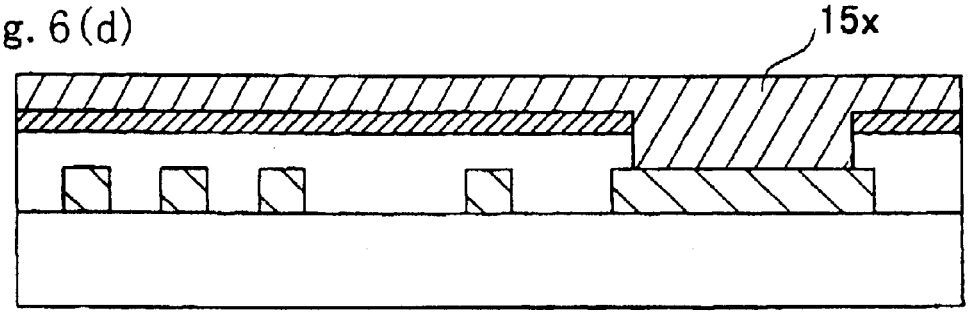

Subsequently, as is shown in FIG. 6(c), the opening 20a is formed in an area for the bonding pad 15 in the surface protecting film 20 including the two films 13 and 14. Furthermore, as is shown in FIG. 6(d), a metal film 15x is deposited so as to fill the opening 20a of the surface protecting film 20 and extend over the passivation film 14. At this point, the metal film 15x is formed by stacking a Ti type barrier metal with a thickness of approximately 100 nm, an Al type alloy film with a thickness of approximately 1000 nm and a Ti type anti-reflective film with a thickness of approximately 50 nm.

Figure 7:
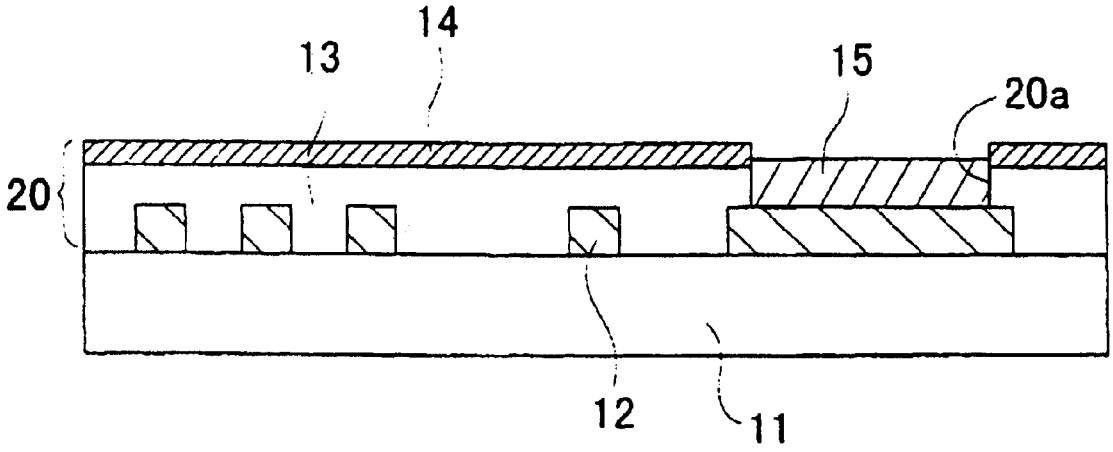
FIG. 7 is a sectional view of a semiconductor device according to a modification of the third embodiment.

Furthermore, the metal film 15x is removed by the CMP or the like until at least the top surface of the passivation film 14 is exposed, thereby allowing the metal film 15x to remain within the opening 20a alone without conducting an additional masking procedure. Thus, the bonding pad 15 can be formed in a self-alignment manner. In this manner, the structure of the semiconductor device as is shown in FIGS. 5 or 7 can be obtained.

The manufacturing procedures of this embodiment are very economical as compared with those of the first embodiment because one masking procedure in the patterning for forming the bonding pad 15 can be omitted.

In filling the area for the housing pad 15 with the metal film 15x, in stead of the procedure shown in FIG. 6(d), the metal film 15x for the bonding pad can be formed by so-called selective CVD in which tungsten or aluminum is selectively deposited on the surface of the metal wire 12 exposed within the opening 20a of the surface protecting film 20. Also in this case, the bonding pad 15 can be formed in a self-alignment manner, and hence, the same effects attained by using the CMP can be attained. In adopting the selective CVD, the thickness of the deposited metal film 15x can be equal to the thickness of the buried insulating film 13 within the opening 20a for forming the bonding pad 15 (specifically, 800 nm or more in this embodiment).

In filling the area for forming the bonding pad 15 with the metal film 15x in this embodiment, the opening 20a having substantially the same area as the bonding pad 15 is formed on the metal wire 12 below. Furthermore, the metal film 15x completely covers at least the buried insulating film 13 with a small dielectric constant in the composite film of the surface protecting film 20, and the top surface of the bonding pad 15 is placed at the same level as the top surface of the passivation film 14 (as is shown in the structure of FIG. 5) or at a lower level than the top surface of the passivation film 14 (as is shown in the structure of FIG. 7).

As described above, according to this embodiment, a semiconductor device with high reliability and high performance can be obtained as in the first embodiment. In addition, since the bonding pad 15 can be buried in the opening 20a of the surface protecting film 20 in a self-alignment manner, one masking process for the patterning can be omitted. This embodiment is thus very economical.

Embodiment 4

Figure 8:
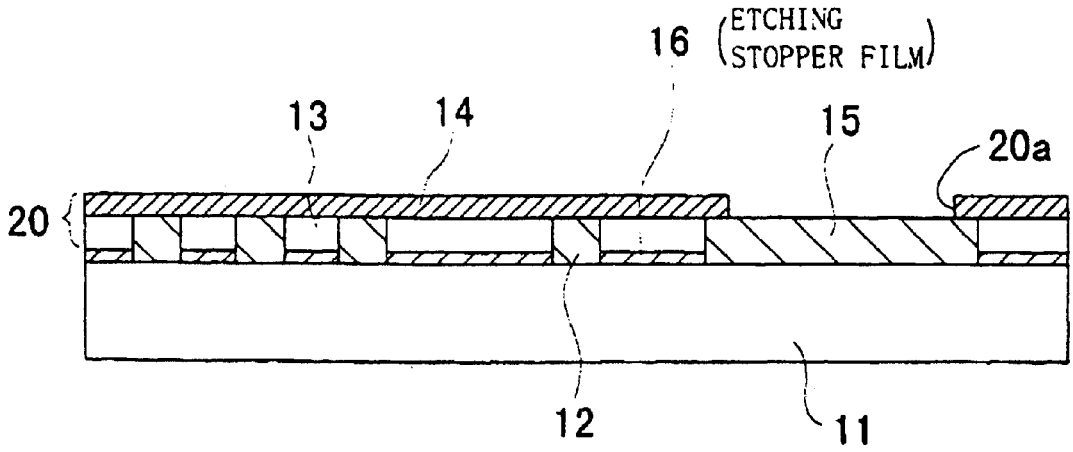
FIG. 8 is a sectional view of a semiconductor device according to a fourth embodiment.

A fourth embodiment of the invention will now be described. FIG. 8 is a sectional view for showing the structure of a semiconductor device of the fourth embodiment.

As is shown in FIG. 8, on an underlying interlayer insulating film 11 is formed a metal wire layer including a plurality of metal wires 12 formed by stacking and then patterning a Ti film and the like. Furthermore, in areas among the metal wires 12, a buried insulating film 13 of an insulating film with a small dielectric constant (such as a TEOS film) is formed with an etching stopper film 16 of a silicon nitride film formed therebelow. In other words, the buried insulating film 13 is filled between the metal wires 12. The top surfaces of the buried insulating film 13 and the metal wires 12 are at substantially the same level. Moreover, a passivation film 14 of a silicon nitride film with a large dielectric constant and high moisture absorption resistance is formed so as to cover the buried insulating film 13 and the metal wires 12. The buried insulating film 13 and the passivation film 14 together work as a surface protecting film 20, and an opening 20a is formed in the passivation film 14 alone in the surface protecting film 20. Thus, the surface of one of the metal wires 12 is exposed, so that the exposed wire can work as a bonding pad 15.

Now, manufacturing procedures for the semiconductor device of this embodiment will be described with reference to FIGS. 9(a) through 9(e).

Figure 9A:
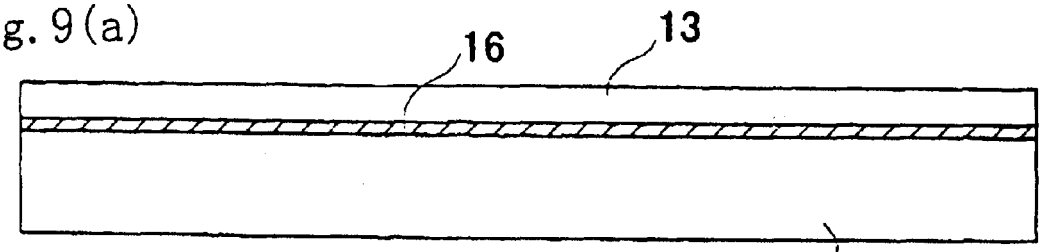
FIGS. 9(a) through 9(e) are sectional views for illustrating manufacturing procedures for the semiconductor device of the fourth embodiment.

First, as is shown in FIG. 9(a), the interlayer insulating film 11 is formed on a substrate already bearing other elements, the etching stopper film 16 (of, for example, a silicon nitride film) is deposited thereon, and the buried insulating film 13 with a small dielectric constant is further deposited thereon. At this point, the interlayer insulating film 11 is formed out of a TEOS film (with a dielectric constant of approximately 3.5) deposited by the CVD in the plasma atmosphere. The buried insulating film 13 with a small dielectric constant is formed out of a TEOS film (with a dielectric constant of approximately 3.5) deposited by the CVD in the plasma atmosphere, having a thickness of 600 nm. The thickness of the etching stopper film 16 depends upon the etching selectivity against the TEOS film used as the buried insulating film 13. In this embodiment, a silicon nitride film with a thickness of 30 nm is deposited as the etching stopper film 16 since the etching selectivity is herein 20 or more. Furthermore, the underlying interlayer insulating film 11 is assumed to be sufficiently flattened, and hence, the buried insulating film 13 above the interlayer insulating film 11 is not particularly flattened.

At this point, a via hole (not shown) for connecting with a wire in a lower layer is already formed directly below the etching stopper film 16, and the etching stopper film 16 can be deposited after forming the via hole, or can be deposited before forming the via hole so as to be used also as a stopper film in filling the via hole with a metal.

Figure 9B:
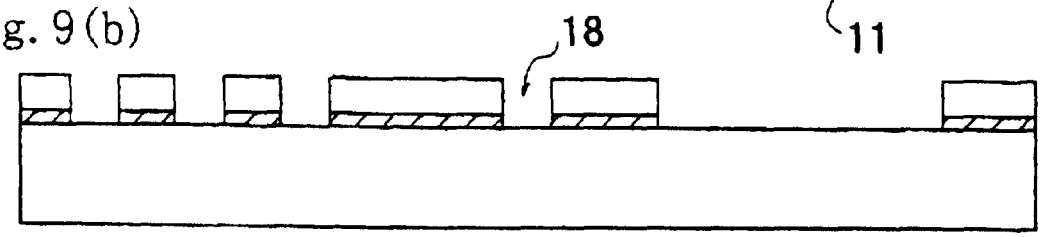

Next, as is shown in FIG. 9(b), the buried insulating film 13 is etched, thereby forming grooves 18 for burying the metal wires. At this point, the buried insulating film 13 can be selectively removed by utilizing the selectivity against the etching stopper film 16. In the case where the etching stopper film 16 is formed before forming the via hole as described above, the top surface of the via hole is exposed at this point. In the case where the etching stopper film 16 is formed simultaneously with the deposition of the buried insulating film 13 after forming the via hole, the etching stopper film 16 exposed at the bottom of each groove 18 is required to be removed for the connection with the via hole formed directly below as is shown in FIG. 9(b).

Figure 9C:
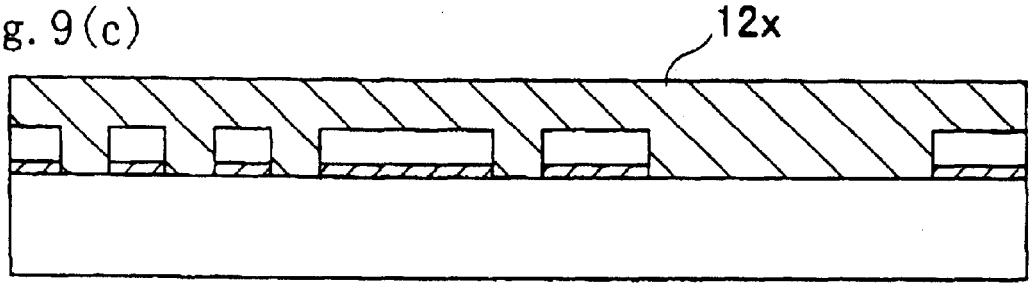
Figure 9D:
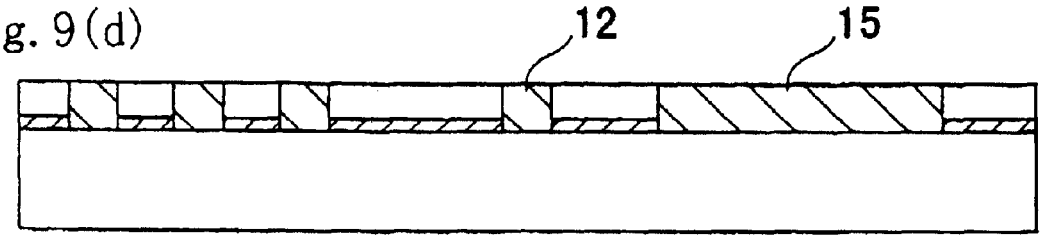

Subsequently, as is shown in FIG. 9(c), a metal film 12x for forming the metal wires is deposited on the entire surface of the substrate with the grooves 18 formed. Then, as is shown in FIG. 9(d), the metal film 12x is removed and flattened until the top surface of the buried insulating film 13 is exposed by the CMP or the like. Thus, the buried metal wires 12 and the bonding pad 15 are formed. In depositing the metal film 12x for the metal wires, a Ti type barrier metal with a thickness of approximately 100 nm and an Al type alloy film with a thickness of approximately 600 nm are successively deposited so as to sufficiently fill the groove 18 with a large width.

Figure 9E:
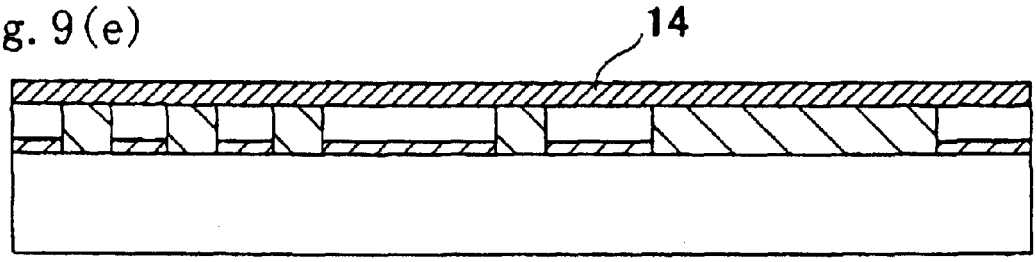

Then, as shown in FIG. 9(e), the passivation film 14 with a large dielectric constant and high moisture absorption resistance is formed on the buried insulating film 13 and the metal wires 12, and an opening 14a is formed in an area for the bonding pad. Thus, the semiconductor device of the fourth embodiment having the structure shown in FIG. 8 can be obtained. The passivation film 14 is formed out of a silicon nitride film (with a dielectric constant of approximately 7.5) deposited by the CVD in the plasma atmosphere, having a thickness of 100 nm.

According to this embodiment, since the fine area between the metal wires 12 is surrounded by the buried insulating film 13, there is no need to consider a coverage defect at a step portion of the passivation film 14 formed above, and there is no fear of the occurrence of a pin hole and a crack and the local stress increase. Therefore, the thickness of the passivation film 14 can be set at a necessary minimum value. Accordingly, this embodiment can provide a semiconductor device with high reliability and high performance as the first embodiment. In addition, this embodiment is very useful because the metal wires 12 and the bonding pad 15 can be formed in one layer alone and the manufacturing method is simple including a smaller number of procedures.

Embodiment 5

Figure 10:
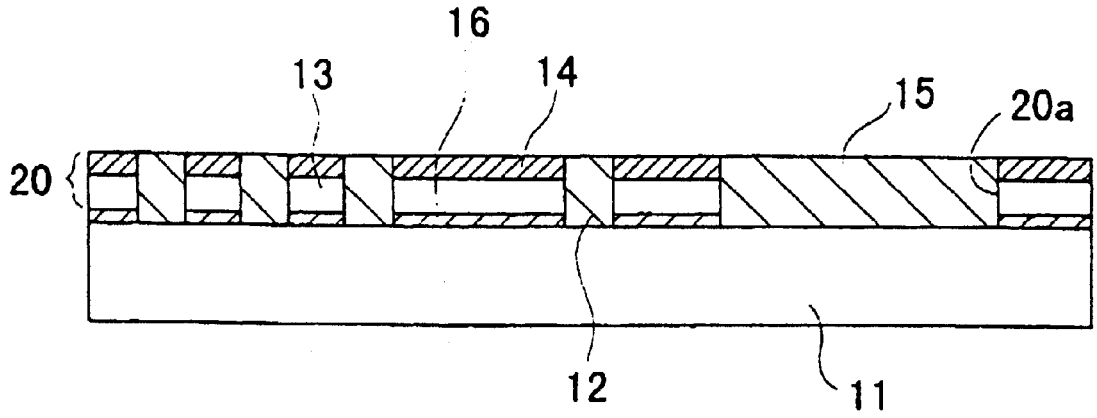
FIG. 10 is a sectional view of a semiconductor device according to a fifth embodiment.

A fifth embodiment of the invention will now be described. FIG. 10 is a sectional view of a semiconductor device of the fifth embodiment.

As is shown in FIG. 10, on an underlying interlayer insulating film 11 is formed a metal wire layer including a plurality of metal wires 12 formed by stacking and then patterning a Ti film and the like. In areas among the metal wires 12, a buried insulating film 13 of an insulating film with a small dielectric constant (such as a TEOS film) and a passivation film 14 with a large dielectric constant and high moisture absorption resistance are formed with an etching stopper film 16 formed therebelow. The metal wires 12 are buried in the insulating film 13 and the passivation film 14. The buried insulating film 13 and the passivation film 14 together work as a surface protecting film 20, in which an opening 20a is formed. One metal wire 12 within the opening 20a works as a bonding pad 15. The top surfaces of the passivation film 14 and the metal wires 12 are placed at substantially the same level. At this point, the top surfaces of the metal wires 12, including not only one working as the bonding pad 15 but also those working as interconnections, are exposed after forming the surface protecting film 20.

Figure 11A:
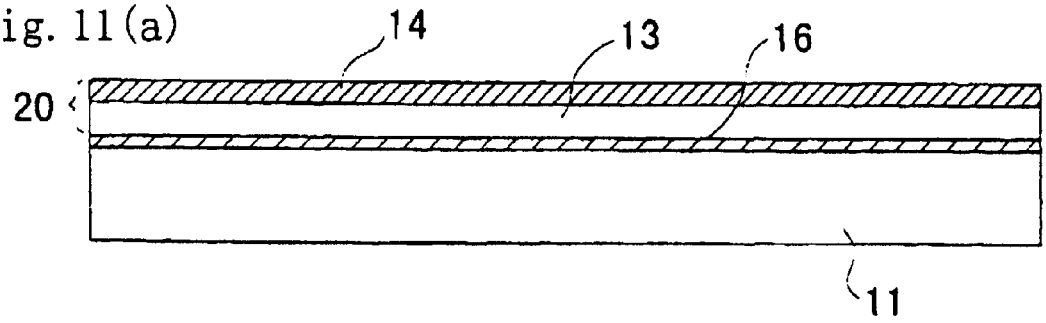
FIGS. 11(a) through 11(c) are sectional views for illustrating manufacturing procedures for the semiconductor device of the fifth embodiment.

Now, manufacturing procedures for the semiconductor device of this embodiment will be described with reference to FIGS. 11(a) through 11(c).

First, the interlayer insulating film 11 is formed on a substrate already bearing other elements, the etching stopper film 16 (of, for example, a silicon nitride film) is formed thereon, and the buried insulating film 13 with a small dielectric constant and the passivation film 14 with a large dielectric constant and high moisture absorption resistance are successively deposited thereon. At this point, the interlayer insulating film 11 is formed out of a TEOS film (with a dielectric constant of approximately 3.5) deposited by the CVD in the plasma atmosphere, and the interlayer insulating film 11 is flattened by the CMP or the like. Furthermore, the buried insulating film 13 with a small dielectric constant is formed out of a TEOS film (with a dielectric constant of approximately 3.5) deposited by the CVD in the plasma atmosphere, having a thickness of 500 nm. The passivation film 14 is formed out of a silicon nitride film (with a dielectric constant of approximately 7.5) deposited by the CVD in the plasma atmosphere, having a thickness of 100 nm. The thickness of the etching stopper film 16 depends upon the etching selectivity against the TEOS film used as the buried insulating film 13, and in this embodiment, a silicon nitride film with a thickness of 30 nm is deposited as the etching stopper film 16 since the etching selectivity is herein 20 or more. Also, the interlayer insulating film 11 is assumed to be sufficiently flattened, and hence, the buried insulating film 13 is not particularly flattened.

At this point, a via hole (not shown) for connecting with a wire in a lower layer is already formed directly below the etching stopper film 16. The etching stopper film 16 can be deposited after forming the via hole, or can be deposited before forming the via hole so as to be used also as a stopper film in filling the via hole with a metal.

Figure 11B:
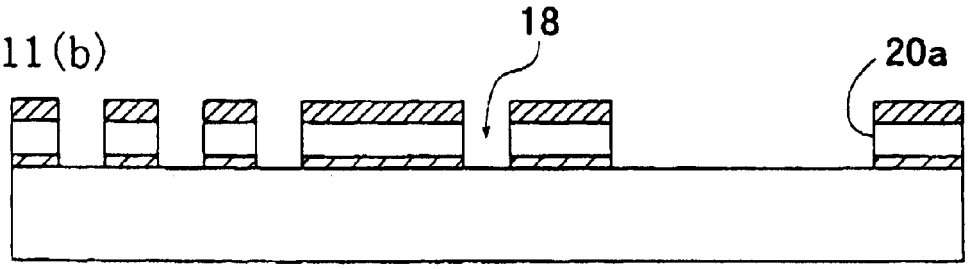

Then, as is shown in FIG. 11(b), the passivation film 14 and the buried insulating film 13 are etched, thereby forming grooves 18 for the buried metal wires and the opening 20a for the bonding pad. At this point, the buried insulating film 13 can be selectively removed by utilizing the etching selectivity against the etching stopper film 16. In the case where the etching stopper film 16 is formed before forming the via hole as described above, the top face of the via hole is exposed at this point. In the case where the etching stopper film 16 is formed simultaneously with the deposition of the buried insulating film 13 after forming the via hole, the etching stopper film 16 exposed at the bottom of each groove 18 is required to be removed for connection with the via hole formed directly below as is shown in FIG. 11(b).

Figure 11C:
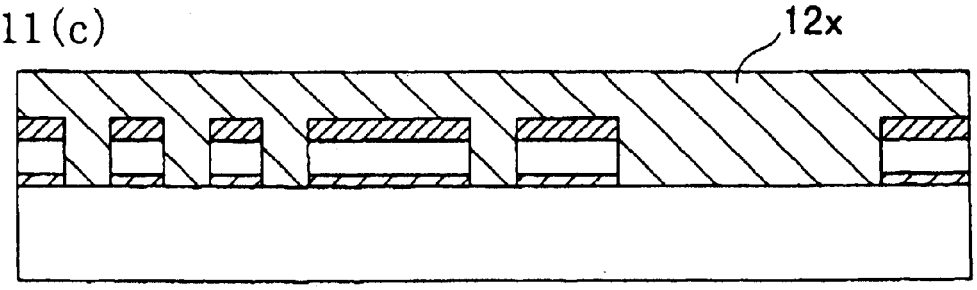

Subsequently, as is shown in FIG. 11(c), a metal film 12x for the metal wires is deposited on the entire surface of the substrate with the grooves 18 formed. In depositing the metal film 12x for the metal wires, a Ti type barrier metal with a thickness of approximately 100 nm and an Al type alloy film with a thickness of approximately 600 nm are successively deposited so as to sufficiently fill the groove 18 with a large width.

Procedures thereafter are not shown in the drawings, but the metal film 12x excluding that filled in the grooves 18 is removed by the CMP or the like, thereby forming the buried metal wires 12 and the bonding pad 15. In this manner, the semiconductor device of the fifth embodiment with the structure as shown in FIG. 10 can be obtained.

According to this embodiment, a semiconductor device with high reliability and high performance can be obtained as in the fourth embodiment. In addition, the metal wires 12 and the bonding pad 15 can be formed in one layer alone, and a procedure for forming the opening on the bonding pad 15 can be advantageously omitted as compared with the fourth embodiment. Accordingly, the manufacturing method of this embodiment is very simple including a further smaller number of procedures.

Embodiment 6

Figure 12:
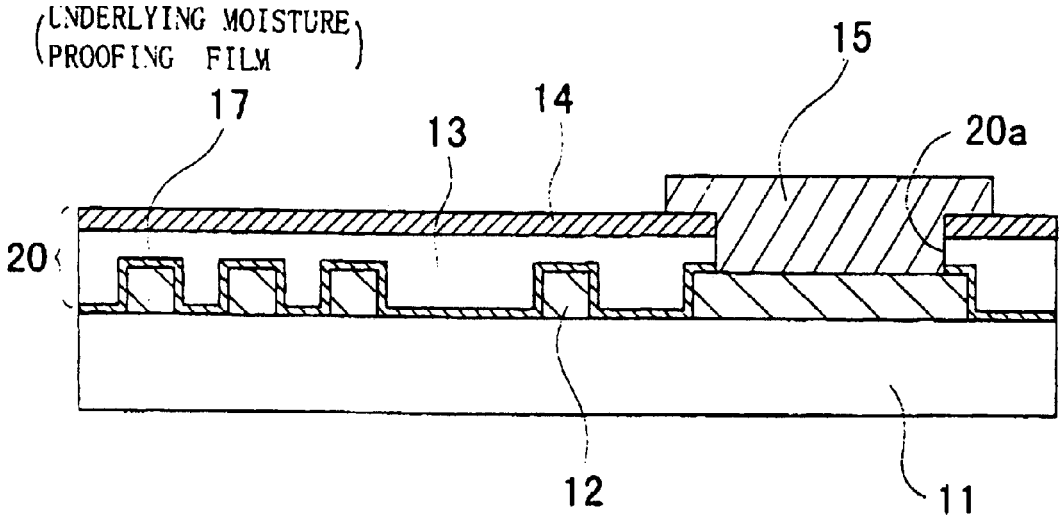
FIG. 12 is a sectional view of a semiconductor device according to a sixth embodiment.

A sixth embodiment of the invention will now be described. FIG. 12 is a sectional view for showing the structure of a semiconductor device of the sixth embodiment.

As is shown in FIG. 12, on an underlying interlayer insulating film 11 is formed a metal wire layer including a plurality of metal wires 12 formed by stacking and then patterning a Ti film and the like. The metal wires 12 and the underlying interlayer insulating film 11 are covered with an underlying moisture proofing film 17 of a film with high moisture absorption resistance (such as a silicon nitride film). On the underlying moisture proofing film 17, a buried insulating film 13 of an insulating film with a small dielectric constant (such as a TEOS film) and a passivation film 14 of an insulating film with a large dielectric constant and high moisture absorption resistance (such as a silicon nitride film) are successively deposited. In other words, a surface protecting film 20 is formed out of a composite film including the underlying moisture proofing layer 17, the buried insulating film 13 and the passivation film 14 in this embodiment. Therefore, in areas among the metal wires 12, at least an area having the minimum wire pitch is filled with the buried insulating film 13 with a small dielectric constant and the underlying moisture proofing layer 17 with a large dielectric constant but a small thickness.

Furthermore, a bonding pad 15 is formed so as to fill an opening 20a of the surface protecting film 20 including the three films 13, 14 and 17 to be connected with the metal wire 12. In addition, the bonding pad 15 completely covers the side faces of the buried insulating film 13 with a small dielectric constant within the opening 20a and is drawn above the passivation film 14.

At this point, since the bonding pad 15 is formed so as to be exposed above the passivation film 14, it is preferably formed out of not an easily oxidized metal such as Cu but an electrode material mainly including an Al or Au type alloy.

Now, manufacturing procedures for the semiconductor device of FIG. 12 will be described with reference to FIGS. 13(a) through 13(d).

Figure 13A:
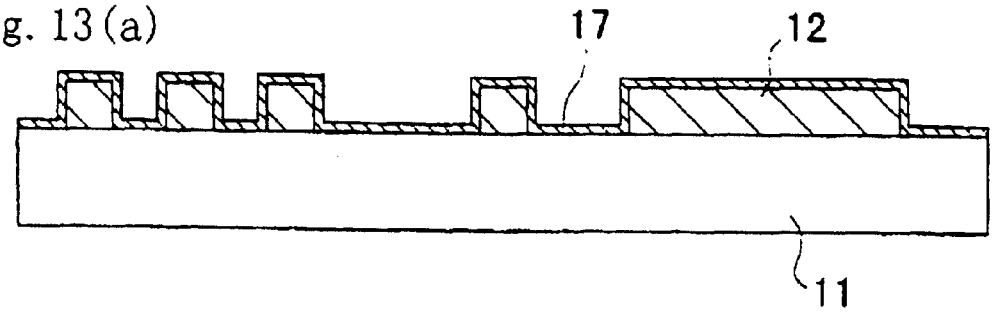
FIGS. 13(a) through 13(d) are sectional views for illustrating manufacturing procedures for the semiconductor device of the sixth embodiment.

First, as shown in FIG. 13(a), the interlayer insulating film 11 is formed on a substrate already bearing other elements, and the metal wires 12 are formed thereon. At this point, the interlayer insulating film 11 is formed out of a TEOS film (with a dielectric constant of approximately 3.5) deposited by the CVD in the plasma atmosphere. The surface of the interlayer insulating film 11 is flattened by the CMP or the like. The metal wire 12 are formed by stacking and then patterning a Ti barrier metal with a thickness of approximately 100 nm, an Al type alloy film with a thickness of approximately 1000 nm and a Ti type anti-reflective film with a thickness of approximately 50 nm. The underlying moisture proofing film 17 is formed, so as to cover the interlayer insulating film 11 and the metal wires 12, out of a silicon nitride film with a thickness of approximately 30 nm.

Figure 13B:
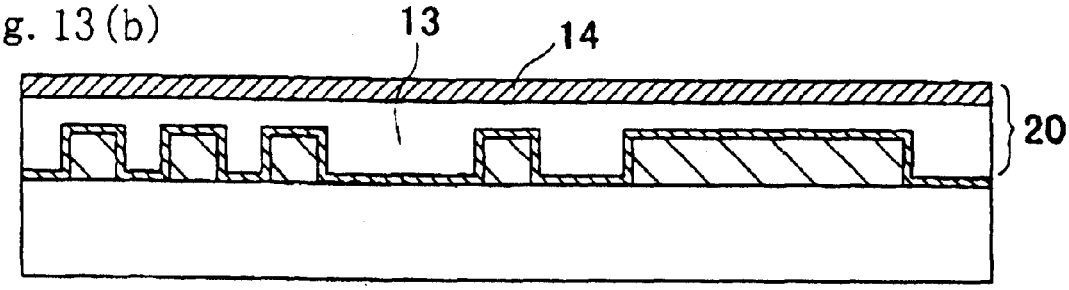

Then, as shown in FIG. 13(b), the buried insulating film 13 with a small dielectric constant and the passivation film 14 with a large dielectric constant and high moisture absorption resistance are successively deposited, thereby forming the surface protecting film 20 of the composite film including these films. At this point, the buried insulating film 13 with a small dielectric constant is formed out of a TEOS film (with a dielectric constant of approximately 3.5) deposited by the CVD in the plasma atmosphere. The composition of the passivation film 14 is the same as that described in the first embodiment.

At this point, the surface of the buried insulating film 13 is preferably flattened over the entire surface of the substrate by the CMP or the like before depositing the silicon nitride film as the passivation film 14 as is shown in FIG. 13(b). In this case, the TEOS film is previously deposited in a thickness as large as approximately 1500 nm, and is polished by approximately 700 nm, so that the resultant thickness of the TEOS film is 800 nm. In this manner, since the fine area between the metal wires is filled with the buried insulating film 13 with a small dielectric constant, there is no need to consider a coverage defect at a step portion of the passivation film 14 formed above, and there is no fear of the occurrence of a pin hole and a crack and the local stress increase. Thus, the thickness of the passivation film 14 can be set at a necessary minimum value.

Figure 13C:
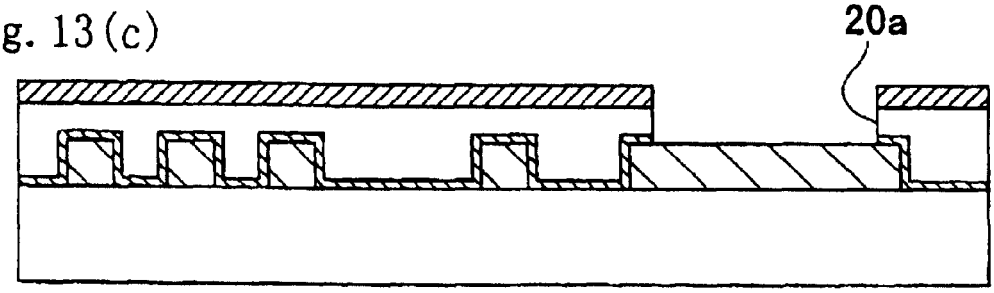
Figure 13D:
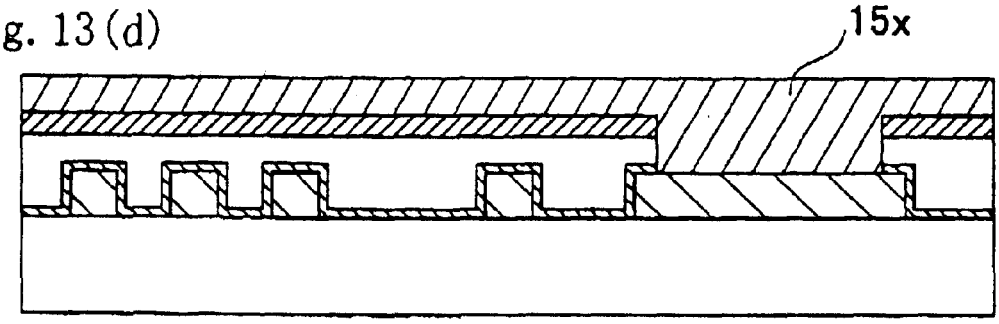

Subsequently, as is shown in FIG. 13(c), the opening 20a is formed in an area for the bonding pad in the surface protecting film 20. Furthermore, as is shown in FIG. 13(d), a metal film 15x is deposited so as to fill the opening 20a of the surface protecting film 20 and extend over the passivation film 14. At this point, the metal film 15x is formed by stacking a Ti layer barrier metal with a thickness of approximately 100 nm, an Al type alloy film with a thickness of approximately 1000 nm and a Ti type anti-reflective film with a thickness of approximately 50 nm.

Procedures thereafter are not shown in the drawings, and the metal film 15x of FIG. 13(d) is patterned, thereby forming the bonding pad 15 as is shown in FIG. 12. Thus, the structure of the semiconductor device of the sixth embodiment can be obtained.

The types and the thicknesses of the films used as the respective elements described above are given merely as examples, and it goes without saying that other compositions are applicable.

In this embodiment, in filling the area for the bonding pad 15 with the metal film 15x, the opening 20a having substantially the same area as the bonding pad 15 is formed on the metal wire 12 below.

According to this embodiment, the same effects as described in the first embodiment can be exhibited, and moreover, the moisture proofing function can be further enhanced due to the underlying moisture proofing film 17 as compared with the first embodiment. In contrast, not only the insulating film with a small dielectric constant (i.e., the buried insulating film 13) but also the underlying moisture proofing film 17 is present in the areas among the metal wires 12. However, even though the underlying moisture proofing film 17 is made from a material with a large dielectric constant, the capacity between the wires is not largely increased as compared with that in the first embodiment because the thickness of the underlying moisture proofing film 17 can be very small. In other words, as compared with the conventional structure, the parasitic capacitance of the wires can be decreased, and the resultant semiconductor device can exhibit high reliability and high performance.

Embodiment 7

Figure 14:
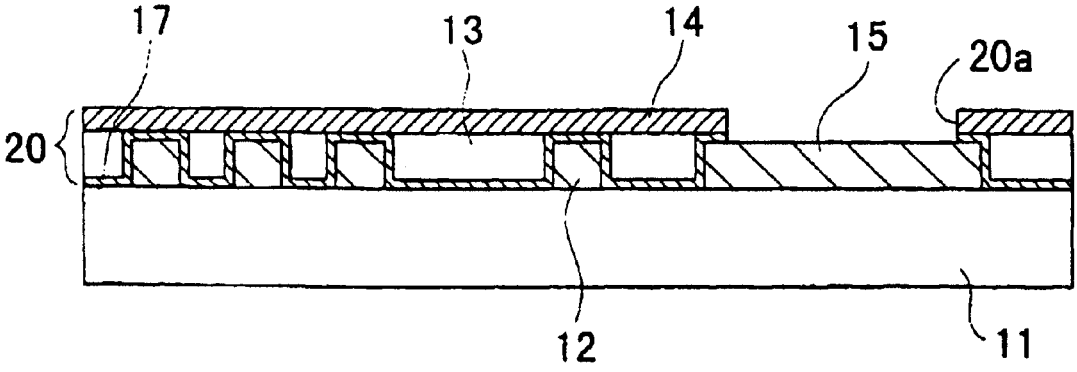
FIG. 14 is a sectional view of a semiconductor device according to a seventh embodiment.

A seventh embodiment of the invention will now be described. FIG. 14 is a sectional view for showing the structure of a semiconductor device of the seventh embodiment.

As is shown in FIG. 14, on an underlying interlayer insulating film 11 is formed a metal wire layer including a plurality of metal wires 12 formed by stacking and then patterning a Ti film and the like. In areas among the metal wires 12, a buried insulating film 13 of an insulating film with a small dielectric constant (such as a TEOS film) is formed with an underlying moisture proofing film 17 of a film with high moisture absorption resistance (such as a silicon nitride film) formed therebelow. In other words, in this embodiment, a surface protecting film 20 is formed out of a composite film including the underlying moisture proofing film 17, the buried insulating film 13 and a passivation film 14. Therefore, in this embodiment, in the areas among the metal wires 12, at least an area having the minimum wire pitch is filled with the buried insulating film 13 with a small dielectric constant and the underlying moisture proofing film 17. The top surfaces of the underlying moisture proofing film 17 and the buried insulating film 13 are placed at substantially the same level. Furthermore, the passivation film 14 of a silicon nitride film with a large dielectric constant and high moisture absorption resistance is formed so as to cover the buried insulating film 13 and the metal wires 12 with the underlying moisture proofing film 17 disposed therebetween. Moreover, in an area for a bonding pad in the passivation film 14, an opening 20a is formed, so that a part of the metal wire 12 is exposed in the opening 20a to work as a bonding pad 15.

Now, manufacturing procedures for the semiconductor device of this embodiment will be described with reference to FIGS. 15(a) through 15(c).

Figure 15A:
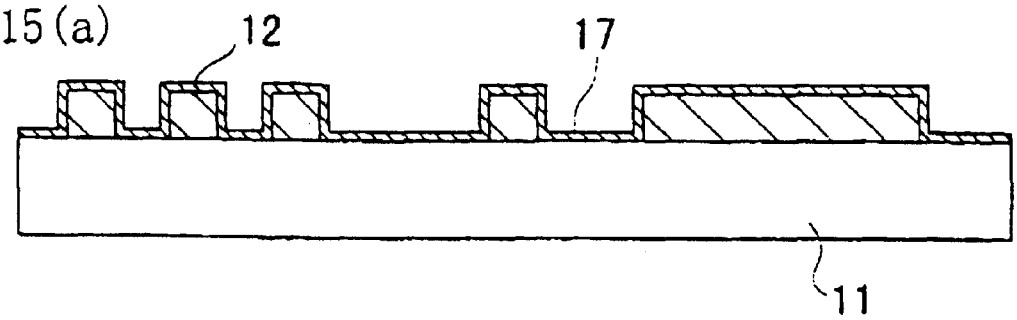
FIGS. 15(a) through 15(c) are sectional views for illustrating manufacturing procedures for the semiconductor device of the seventh embodiment.

First, as is shown in FIG. 15(a), the interlayer insulating film 11 is formed on a substrate already bearing other elements, and the metal wires 12 are formed thereon. The interlayer insulating film 11 is formed out of a TEOS film (with a dielectric constant of approximately 3.5) deposited by the CVD in the plasma atmosphere. The surface of the interlayer insulating film 11 is flattened by the CMP or the like. The metal wires 12 are formed by stacking and then patterning a Ti type barrier metal film with a thickness of approximately 100 nm, an Al type alloy film with a thickness of approximately 600 nm and a Ti type anti-reflective film with a thickness of approximately 50 nm. Then, the underlying moisture proofing film 17 is formed, so as to cover the interlayer insulting film 11 and the metal wires 12, out of a silicon nitride film with a thickness of approximately 30 nm.

Figure 15B:
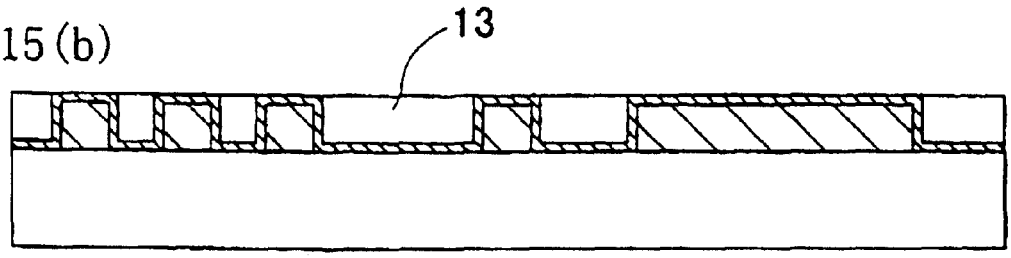

Next, as shown in FIG. 15(b), the buried insulating film 13 with a small dielectric constant is deposited, and the surfaces of the underlying moisture proofing film 17 and the buried insulating film 13 are flattened by the CMP or the like. At this point, the buried insulating film 13 with a small dielectric constant is formed out of a TEOS film (with a dielectric constant of approximately 3.5) deposited by the CVD in the plasma atmosphere. In flattening the TEOS film by the CMP, the silicon nitride film used as the underlying moisture proofing film 17 functions as an etching stopper.

Figure 15C:
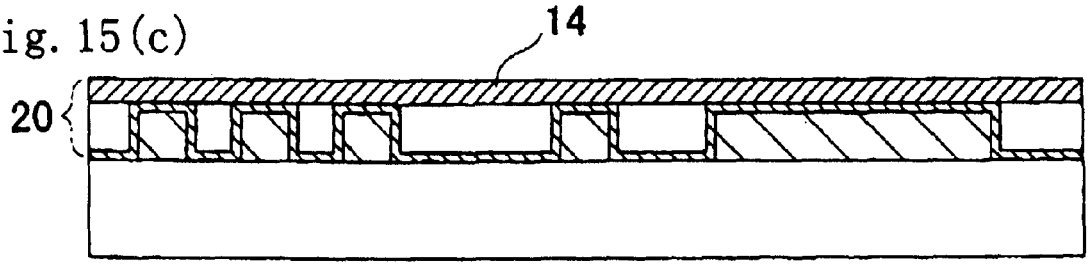

Then, as is shown in FIG. 15(c), the passivation film 14 with a large dielectric constant and high moisture absorption resistance is formed on the underlying moisture proofing film 17 and the buried insulating film 13, and the opening 20a is formed in an area for the bonding pad. Thus, the semiconductor device of the seventh embodiment having the structure as shown in FIG. 14 can be obtained. The passivation film 14 is formed out of a silicon nitride film (with a dielectric constant of approximately 7.5) deposited by the CVD in the plasma atmosphere, having a thickness of 100 nm.

According to this embodiment, not only the effects of the fourth embodiment can be exhibited but also the moisture proofing function can be more definitely exhibited due to the underlying moisture proofing film 17.

Embodiment 8

Figure 16:
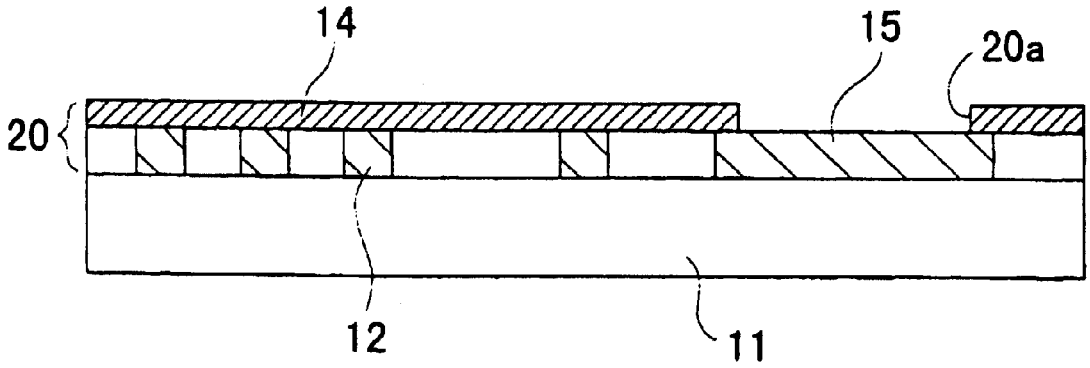
FIG. 16 is a sectional view of a semiconductor device according to an eighth embodiment.

In the seventh embodiment, the underlying moisture proofing film 17 is not necessarily formed. FIG. 16 is a sectional view of a semiconductor device according to an eighth embodiment, in which the underlying moisture proofing film 17 of the semiconductor device of the seventh embodiment (shown in FIG. 14) is omitted.

Figure 17A:
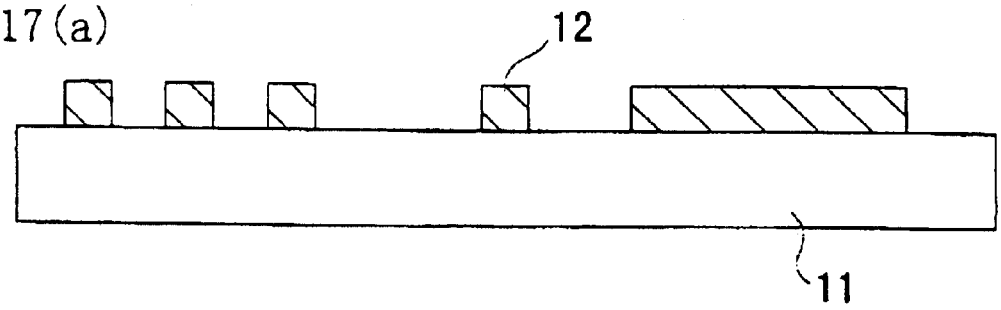
FIGS. 17(a) through 17(c) are sectional views for illustrating manufacturing procedures for the semiconductor device of the eighth embodiment.
Figure 17B:
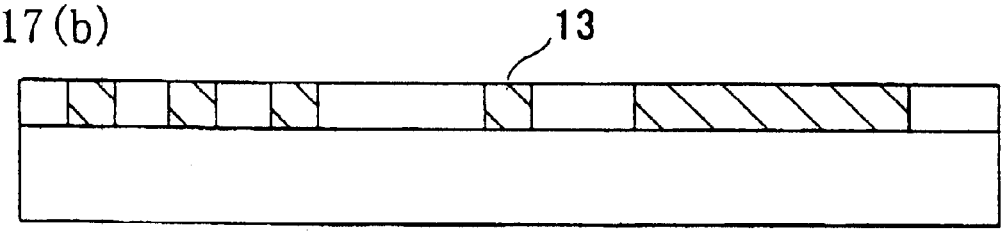
Figure 17C:
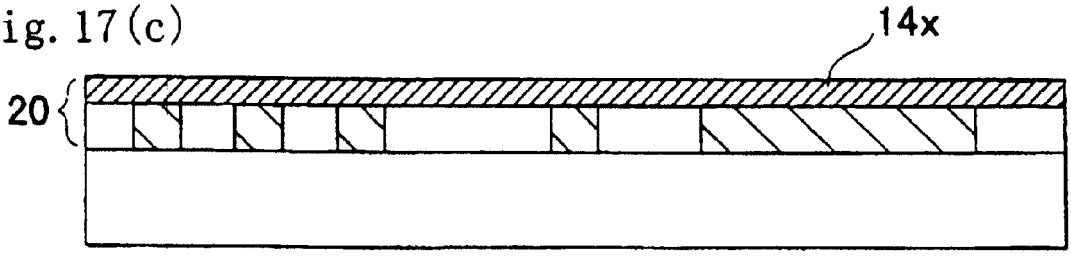
Figure 18:
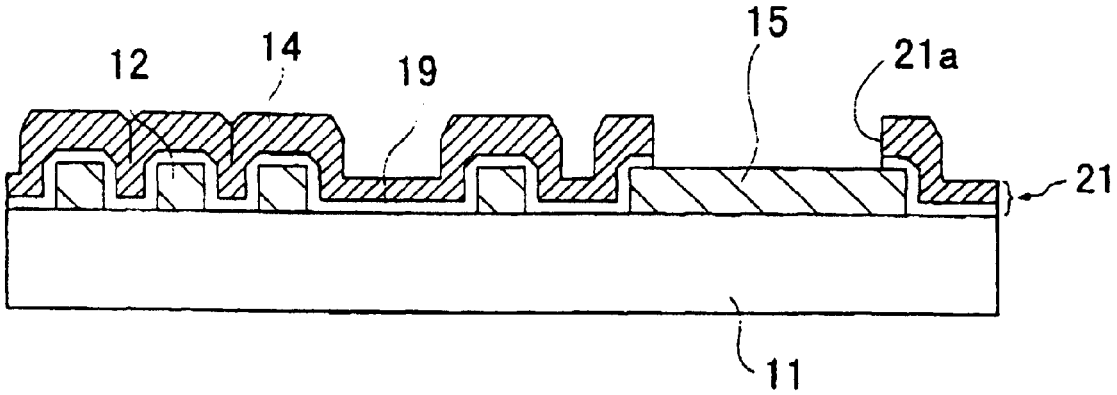
Fig. 18 PRIOR ART
FIG. 18 is a sectional view for showing the structure of a conventional semiconductor device.
Figure 19A:
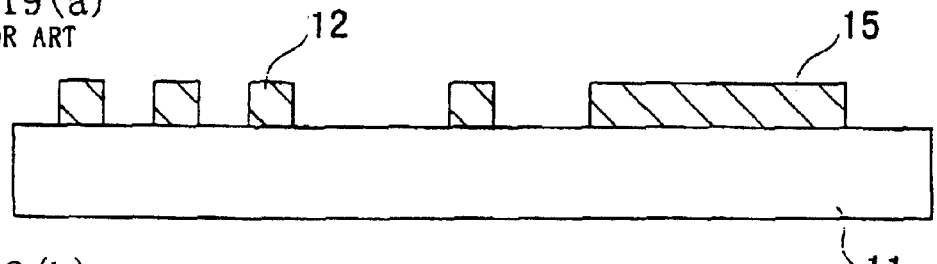
Fig. 19(a) PRIOR ART
FIGS. 19(a) and 19(b) are sectional views for illustrating manufacturing procedures for the conventional semiconductor device.
Figure 19B:
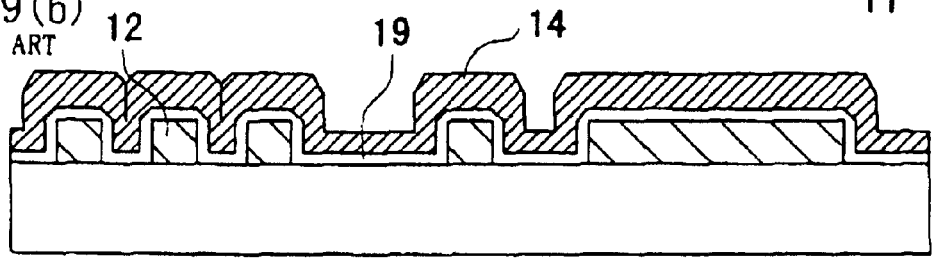
Fig. 19(b) PRIOR ART
Figure 20A:
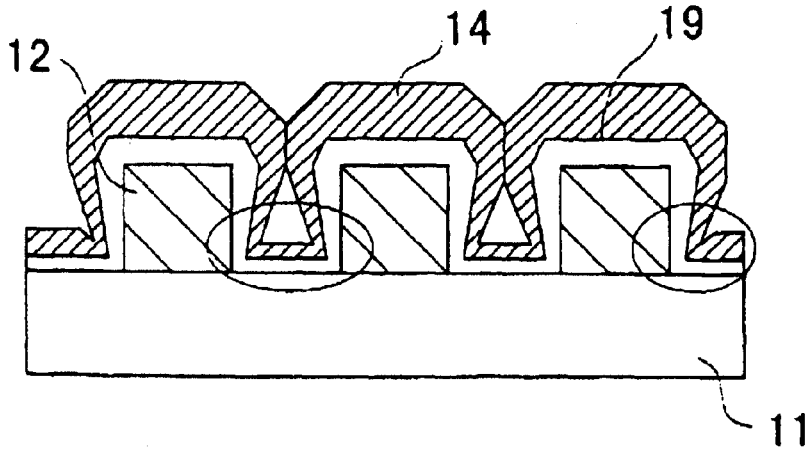
Fig. 20(a) PRIOR ART
FIGS. 20(a) and 20(b) are sectional views of detailed structures in areas among metal wires with a small pitch for illustrating problems of the conventional semiconductor device.
Figure 20B:
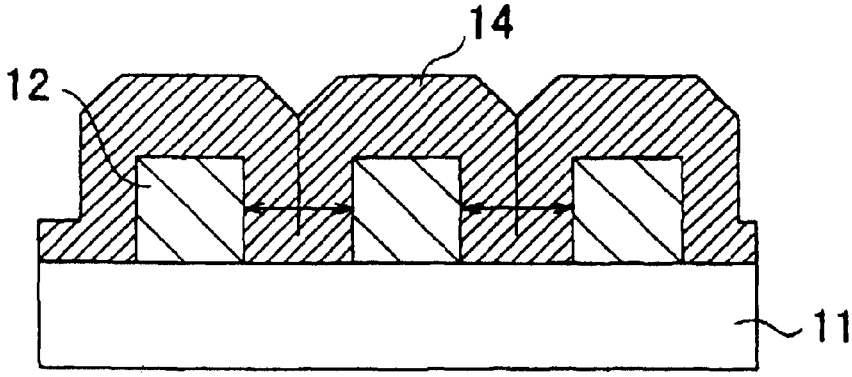
Fig. 20(b) PRIOR ART
Figure 21:
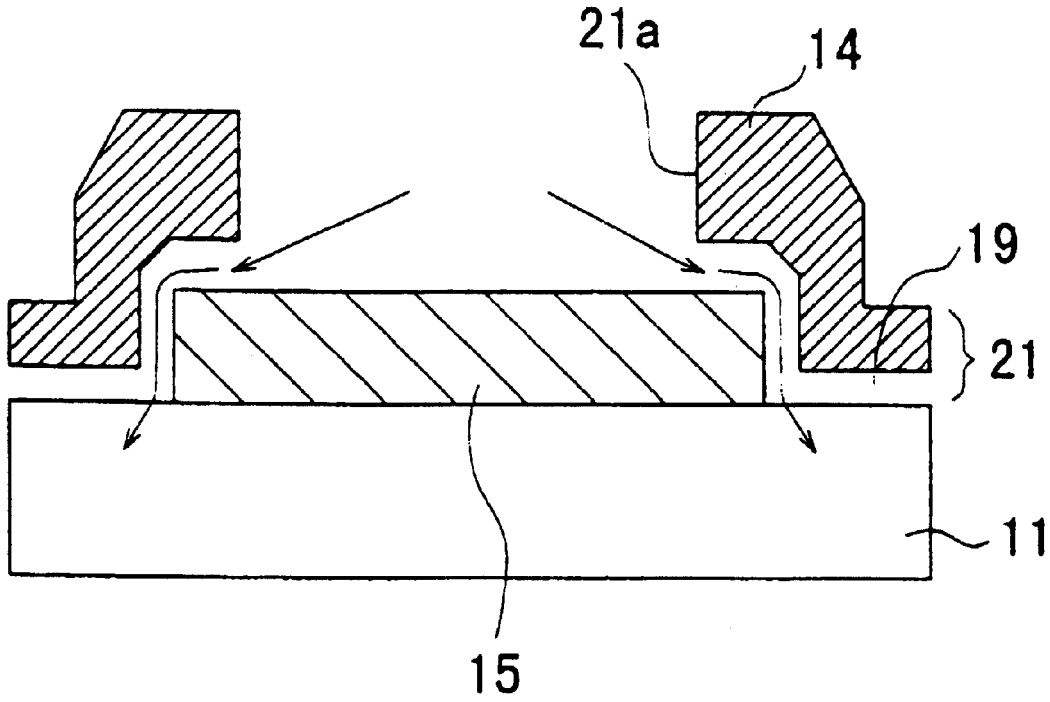
Fig. 21 PRIOR ART
FIG. 21 is a sectional view of a detailed structure in the vicinity of a bonding pad for illustrating another problem of the conventional semiconductor device.

Furthermore, FIGS. 17(a) through 17(c) are sectional views for showing manufacturing procedures for the semiconductor device of this embodiment. First, as is shown in FIG. 17(a), after metal wires 12 are formed on an interlayer insulating film 11, a buried insulating film 13 is deposited on the entire surface of the substrate. The entire top surface of the substrate is then flattened by the CMP, so that the buried insulating film 13 can be filled between the metal wires 12. Thus, the structure shown in FIG. 17(b) can be obtained. Next, as shown in FIG. 17(c), a passivation film 14 is deposited on the buried insulating film 13 and the metal wires 12, and an opening 20a is then formed. In this manner, the structure as is shown in FIG. 16 can be obtained. The types and the thicknesses of the films used as the respective elements are the same as those described in the seventh embodiment.

In each of the aforementioned embodiments, the buried insulating film 13 formed below the passivation film 14 is a silicon oxide film, a silicon oxide film doped with fluorine, a porous silicon oxide film, a composite film including any of these silicon oxide films, or a composite film including any of the these silicon oxide film and an organic insulating film, and preferably has a dielectric constant of at least 3.9 or less. When the buried insulating film 13 has a smaller dielectric constant, the parasitic capacitance of the wires can be smaller, resulting in improving the performance of the resultant circuit.

Furthermore, when the thickness of the buried insulating film 13 is ½ or more as large as the pitch between the metal wires, the areas among the metal wires can be filled with the dielectric film with a small dielectric constant, resulting in exhibiting the effects of the invention. However, when the underlying moisture proofing film is formed, the thickness of the buried insulating film 13 can be ½ or more as large as a value obtained by subtracting twice of the thickness of the underlying moisture proofing film from the pitch between the metal wires.

In each of the aforementioned embodiments, all the areas among the metal wires 12 are filled with the buried insulating film 13, which does not limit the invention. Among all the areas among the metal wires 12, at least the area having the minimum wire pitch can be filled with the buried insulating film 13 of a dielectric film with a small dielectric constant. Therefore, for example, after depositing a silicon oxide film on a metal wire layer, the buried insulating film can be left in an area having a small wire pitch alone by anisotropic etching, and side walls are formed on the side faces of the remaining wires. Then, a passivation film can be formed. In this case, the areas having a large wire pitch are mostly covered with a silicon nitride film (i.e., the passivation film), but the parasitic capacitance is small and a step coverage defect is not caused in such areas. Therefore, the effects of the invention can be usefully exhibited without causing any problem.

Also, the passivation film 14 is preferably made from a silicon nitride film with a large dielectric constant and high moisture absorption resistance.

What is claimed is:

1. A semiconductor device comprising:

a semiconductor substrate bearing semiconductor elements;

an interlayer insulating film formed on said semiconductor substrate;

a metal wire layer including plural metal wires formed on said interlayer insulating film;

a surface protecting film including a first dielectric film with a small dielectric constant for [filling] *forming* at least a part of areas among said metal wires in said metal wire layer and a second dielectric film with a higher moisture absorption preventing function than said first dielectric film for covering said metal wire layer and said first dielectric film, said second dielectric film having a function of suppressing moisture absorption of said first dielectric film;

an opening for a bonding pad formed in said surface protecting film; and a bonding pad forming in said opening for obtaining external electrical connection, wherein said bonding pad and said second dielectric film of said surface protecting film completely cover said first dielectric film within said opening so as not to expose said first dielectric film, *and*

*wherein said entire upper surface of said first dielectric film is substantially flat.*

2. The semiconductor device of claim 1, wherein said first dielectric film is buried, among said areas among said metal wires, at least in an area having a minimum pitch between said metal wires.

3. The semiconductor device of claim 1, wherein said first dielectric film is formed on said interlayer insulating film and said metal wires, and said second dielectric film is formed over said first dielectric film, said opening is formed through said first and second dielectric films, with exposing a part of at least one of said metal wires of said metal wire layer, and said bonding pad is buried in said opening so as to cover a side face of said first dielectric film within said opening and is connected with said at least one of said metal wires.

4. The semiconductor device of claim 3, wherein said bonding pad extends above a top surface of said second dielectric film.

5. The semiconductor device of claim 4, wherein said bonding pad has an area larger than a connecting portion with said at least one of said metal wires, and extends above a top surface of said second dielectric film to reach a portion above said semiconductor elements on said semiconductor substrate.

6. The semiconductor device of claim 3, wherein said bonding pad is buried in said opening with a top surface thereof placed at a level equal to or lower than a top surface of said second dielectric film.

7. The semiconductor device of claim 3, wherein a third dielectric film for preventing moisture absorption is disposed between said first dielectric film and any of said interlayer insulating film and said metal wires.

8. The semiconductor device of claim 7, wherein said third dielectric film is made from a silicon nitride film.

9. The semiconductor device of claim 1, wherein said first dielectric film is formed merely in said areas among said metal wires, said second dielectric film is formed to be in contact with a top surface of said first dielectric film and top surfaces of said metal wires of said metal wire layer, said opening is formed through merely said second dielectric film, and a part of at least one of said metal wires functions as said bonding pad.

10. The semiconductor device of claim 9, wherein a thin etching stopper film with high etching selectivity against said interlayer insulating film is disposed between said first dielectric film and said interlayer insulating film.

11. The semiconductor device of claim 9, wherein a third dielectric film for preventing moisture absorption is disposed between said first dielectric film and any of said interlayer insulating film, said metal wires and said second dielectric film.

12. The semiconductor device of claim 1, wherein said first and second dielectric films are formed merely in said areas among said metal wires, and a part of at least one of said metal wires of said metal wire layer functions as said bonding pad.

13. The semiconductor device of claim 1, wherein said first dielectric film is made from at least one oxide film selected from the group consisting of a silicon oxide film, a silicon oxide film doped with fluorine and a porous silicon oxide film, or a composite film including an organic insulating film and at least one oxide film selected from the group consisting of a silicon oxide film, a silicon oxide film doped with fluorine and a porous silicon oxide film.

14. The semiconductor device of claim 1, wherein said first dielectric film has a dielectric constant of 3.9 or less.

15. The semiconductor device of claim 1, wherein said second dielectric film is made from a silicon nitride film.

16. The semiconductor device of claim 1, wherein said bonding pad directly contacts one of said plural metal wires formed on said interlayer insulating film.

17. The semiconductor device of claim 1, wherein said bonding pad directly contacts said surface protecting film.

*18. A semiconductor device comprising:*

*a semiconductor substrate;*

*an interlayer insulating film formed on said semiconductor substrate;*

*a first dielectric film with a small dielectric constant and metal wires formed on said interlayer insulating film; said first dielectric layer disposed between said metal wires;*

*a second dielectric film, which has a higher moisture absorption preventing function than said first dielectric film, formed on a surface of said first dielectric film and on a surface of each metal wire, said second dielectric film having a function of suppressing moisture absorption by said first dielectric film; and*

*an opening formed in said second dielectric film so as to expose at least one of said metal wires,*

*wherein the surface of said first dielectric film and the surface of said metal wires are flat, and*

*wherein said metal wires under said opening and said second dielectric film completely cover said first dielectric film within said opening so as not to expose said first dielectric film.*

*19. The semiconductor device of claim 18, wherein said first dielectric film is at least formed in an area having a minimum pitch between the metal wires.*

*20. The semiconductor device of claim 18, wherein said first dielectric film is made from an oxide film or a composite film consisting at least one of a TEOS film, a silicon oxide film doped with fluorine and a porous silicon oxide film, or a composite film including an organic insulating film and at least one of a TEOS film, a silicon oxide film doped with fluorine and a porous silicon oxide film.*

*21. The semiconductor device of claim 18, wherein said first dielectric film has a dielectric constant of 3.9 or less.*

*22. The semiconductor device of claim 18, wherein said second dielectric film is made from a silicon nitride film.*

*23. The semiconductor device of claim 18, wherein the second dielectric film is in contact with said at least one metal wire exposed in said opening.*

*24. A semiconductor device comprising:*

*a semiconductor substrate;*

*an interlayer insulating film formed on said semiconductor substrate;*

*a metal wire layer including plural metal wires formed on said interlayer insulating film;*

*a first dielectric film with a small dielectric constant formed on both said interlayer insulating film and said metal wires, a surface of said first dielectric film is flattened by chemical mechanical polishing;*

*a second dielectric film having a higher moisture absorption preventing function than said first dielectric film and formed on the entire surface of said first dielectric film, said second dielectric film having a function of suppressing moisture absorption by said first dielectric film;*

*an opening formed in both said first dielectric film and said second dielectric film such that a portion of at least one of said metal wires in said metal wire layer is exposed; and*

*a bonding pad formed in said opening so as to connect said metal wires under said opening,*

*wherein said bonding pad and said second dielectric film completely cover said first dielectric film within said opening so as not to expose said first dielectric film.*

*25. The semiconductor device of claim 24, wherein said bonding pad extends above a top surface of said second dielectric film.*

*26. The semiconductor device of claim 25, wherein said bonding pad has an area larger than a connecting portion with said metal wires under said opening, and extends above a top surface of said second dielectric film to reach a portion above said semiconductor elements on said semiconductor substrate.*

*27. The semiconductor device of claim 24, wherein said bonding pad is buried in said opening with a top surface thereof placed at a level equal to or lower than a top surface of said second dielectric film.*

*28. The semiconductor device of claim 24, further comprising,*

*a third dielectric film for preventing moisture absorption disposed between said first dielectric film and any of said interlayer insulating film and said metal wires.*

*29. The semiconductor device of claim 28, wherein said third dielectric film is made from a silicon nitride film.*

*30. The semiconductor device of claim 24, wherein said first dielectric film is made from an oxide film or a composite film consisting at least one of a TEOS film, a silicon oxide film doped with fluorine and a porous silicon oxide film, or a composite film including an organic insulating film and at least one of a TEOS film, a silicon oxide film doped with fluorine and a porous silicon oxide film.*

*31. The semiconductor device of claim 24, wherein said first dielectric film has a dielectric constant of 3.9 or less.*

*32. The semiconductor device of claim 24, wherein said second dielectric film is made from a silicon nitride film.*

* * * * *

UNITED STATES PATENT AND TRADEMARK OFFICE

CERTIFICATE OF CORRECTION

PATENT NO. : RE 39,932 E
APPLICATION NO. : 10/438348
DATED : December 4, 2007
INVENTOR(S) : Toshiki Yabu et al.

It is certified that error appears in the above-identified patent and that said Letters Patent is hereby corrected as shown below:

On page 2 of the title page of the Letters Patent,

Under section (56), change "JP 7-312386 10/1993" to -- JP 7-312366 10/1993 --

Signed and Sealed this

Tenth Day of June, 2008

JON W. DUDAS
*Director of the United States Patent and Trademark Office*